US00RE50938E

(19) United States
(12) Reissued Patent
Feng et al.

(10) Patent Number: US RE50,938 E
(45) Date of Reissued Patent: Jun. 30, 2026

(54) SHIFT REGISTER UNIT, GATE DRIVING CIRCUIT, DISPLAY DEVICE AND DRIVING METHOD

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

(21) Appl. No.: 17/827,367

(22) Filed: May 27, 2022

Related U.S. Patent Documents

Reissue of:
(64) Patent No.: 11,170,707
Issued: Nov. 9, 2021
Appl. No.: 16/618,300
PCT Filed: Dec. 26, 2018
PCT No.: PCT/CN2018/123947
§ 371 (c)(1),
(2) Date: Nov. 29, 2019
PCT Pub. No.: WO2019/157865
PCT Pub. Date: Aug. 22, 2019

(30) Foreign Application Priority Data

Feb. 14, 2018 (CN) ..... 201810151627.5
May 31, 2018 (CN) ..... 201810552885.4

(51) Int. Cl.
*G09G 3/3208* (2016.01)
*G11C 19/28* (2006.01)

(52) U.S. Cl.
CPC ..... *G09G 3/3208* (2013.01); *G11C 19/28* (2013.01); *G09G 2300/0426* (2013.01); *G09G 2310/0286* (2013.01); *G09G 2310/08* (2013.01)

(58) Field of Classification Search
CPC ..... G09G 3/3208; G11C 19/28
See application file for complete search history.

(56) References Cited

U.S. PATENT DOCUMENTS 9,459,730 B2 10/2016 Long et al.
9,875,712 B2 1/2018 Ma et al.
(Continued)

FOREIGN PATENT DOCUMENTS

CN 1183604 A 6/1998
CN 101093647 A 12/2007
(Continued)

OTHER PUBLICATIONS

European search report issued Aug. 1, 2022, for corresponding application EP 18906612.9.
(Continued)

*Primary Examiner* — Cameron Saadat
(74) *Attorney, Agent, or Firm* — Nath, Goldberg & Meyer; Joshua B. Goldberg

(57) ABSTRACT

A shift register unit, a gate driving circuit, a display device, and a driving method. The shift register unit includes a blanking input circuit, a display input circuit, an output circuit, and a compensation selection circuit. The blanking input circuit inputs a blanking input signal to a control node, and a blanking signal to a first node in a blanking period of a frame; the display input circuit inputs a display signal to the first node in a display period of the frame in response to a display input signal; the output circuit outputs, under the control of a level of the first node, a composite output signal to an output terminal; the compensation selection circuit is
(Continued)

electrically coupled to the output terminal, and charges, in response to a compensation selection control signal, the control node using the composite output signal.

28 Claims, 11 Drawing Sheets

(56) References Cited

U.S. PATENT DOCUMENTS

| | | | |
|---|---|---|---|
| 10,181,279 | B2 | 1/2019 | Shim et al. |
| 10,210,835 | B2 | 2/2019 | Han et al. |
| 10,216,319 | B2 | 2/2019 | Cho et al. |
| 10,262,615 | B2 | 4/2019 | Hu et al. |
| 10,297,204 | B2 | 5/2019 | Gu et al. |
| 10,475,362 | B2 * | 11/2019 | Wang ..... G09G 3/20 |
| 10,546,536 | B2 | 1/2020 | Kim et al. |
| 10,573,245 | B2 | 2/2020 | Li et al. |
| 10,593,279 | B2 | 3/2020 | Li et al. |
| 10,607,529 | B2 | 3/2020 | Chen |
| 10,643,729 | B2 | 5/2020 | Gu et al. |
| 12,087,198 | B2 | 9/2024 | Feng et al. |
| 2011/0222645 | A1 | 9/2011 | Tobita |
| 2011/0241730 | A1 | 10/2011 | Yamamoto et al. |
| 2011/0291712 | A1 | 12/2011 | Tobita |
| 2014/0085176 | A1 | 3/2014 | Kang |
| 2014/0185737 | A1 | 7/2014 | Jang |
| 2014/0241488 | A1 | 8/2014 | Jang |
| 2015/0015562 | A1 | 1/2015 | Han et al. |
| 2015/0030116 | A1 | 1/2015 | Horiuchi et al. |
| 2015/0036784 | A1 | 2/2015 | Qing et al. |
| 2016/0027371 | A1 | 1/2016 | Hao et al. |
| 2016/0133337 | A1 | 5/2016 | Gu |
| 2016/0217871 | A1 | 7/2016 | Ochiai et al. |
| 2016/0225307 | A1 | 8/2016 | Yoon et al. |
| 2016/0240144 | A1 | 8/2016 | Song et al. |
| 2016/0247446 | A1 | 8/2016 | Cao et al. |
| 2016/0351160 | A1 | 12/2016 | In et al. |
| 2016/0358566 | A1 | 12/2016 | Li et al. |
| 2016/0365061 | A1 | 12/2016 | Hong et al. |
| 2017/0039950 | A1 | 2/2017 | Li et al. |
| 2017/0140703 | A1 | 5/2017 | Nishikawa et al. |
| 2017/0178584 | A1 | 6/2017 | Ma et al. |
| 2017/0193885 | A1 | 7/2017 | Feng et al. |
| 2017/0213499 | A1 | 7/2017 | Kong et al. |
| 2018/0033762 | A1 | 2/2018 | Gowda et al. |
| 2018/0096733 | A1 | 4/2018 | Kim et al. |
| 2018/0113564 | A1 | 4/2018 | Takahashi et al. |
| 2018/0137808 | A1 | 5/2018 | Na et al. |
| 2018/0138256 | A1 | 5/2018 | Han et al. |
| 2018/0204521 | A1 * | 7/2018 | Gu ..... G09G 3/3266 |
| 2018/0299988 | A1 | 10/2018 | Chen |
| 2018/0337682 | A1 | 11/2018 | Takasugi et al. |
| 2019/0244578 | A1 | 8/2019 | Wu et al. |
| 2020/0357352 | A1 | 11/2020 | Du et al. |
| 2021/0335197 | A1 | 10/2021 | Feng et al. |

FOREIGN PATENT DOCUMENTS

| | | | |
|---|---|---|---|
| CN | 101650909 | A | 2/2010 |
| CN | 102804280 | A | 11/2012 |
| CN | 103915058 | A | 7/2014 |
| CN | 104898891 | A | 9/2015 |
| CN | 105185294 | A | 12/2015 |
| CN | 105427825 | A | 3/2016 |
| CN | 105427829 | A | 3/2016 |
| CN | 105679229 | A | 6/2016 |
| CN | 105845060 | A | 8/2016 |
| CN | 105976787 | A | 9/2016 |
| CN | 106023943 | A | 10/2016 |
| CN | 106128384 | A | 11/2016 |
| CN | 106297888 | A | 1/2017 |
| CN | 106356015 | A | 1/2017 |
| CN | 106652933 | A | 5/2017 |
| CN | 106847225 | A | 6/2017 |
| CN | 106952601 | A | 7/2017 |
| CN | 106952610 | A | 7/2017 |
| CN | 106959775 | A | 7/2017 |
| CN | 107039017 | A | 8/2017 |
| CN | 107068088 | A | 8/2017 |
| CN | 107134268 | A | 9/2017 |
| CN | 105427829 | B | 10/2017 |
| CN | 107578741 | A | 1/2018 |
| CN | 108648716 | A | 10/2018 |
| CN | 108682397 | A | 10/2018 |
| CN | 108806611 | A | 11/2018 |
| CN | 104900211 | A | 9/2019 |
| JP | 2018018050 | A | 2/2018 |
| KR | 20040070537 | A | 8/2004 |
| KR | 20160068081 | A | 6/2016 |
| KR | 10-2017-0078978 | A | 7/2017 |
| KR | 20170078978 | A | 7/2017 |

OTHER PUBLICATIONS 18899019.6 EESR issued Oct. 5, 2021.
18899019.6 European communication issued Sep. 22, 2020.
18899020.4 EESR issued Oct. 29, 2021.
18906612.9 EP-IR issued Nov. 8, 2021.
18906612.9 PESR issued Mar. 25, 2022.
CN 201810151876.4 First Office Action issued Mar. 17, 2020, with English translation.
CN 201810552885.4 Second Office Action issued Sep. 2, 2020, with English translation.
PCT-CN2018-122800 ISR issued Mar. 21, 2019, with English translation.
PCT-CN2018-122801 ISR issued Mar. 27, 2019, with English translation.
PCT-CN2018-123947 ISR issued Mar. 29, 2019, with English translation.
U.S. Appl. No. 16/478,366 First Office Action issued Oct. 5, 2021.
U.S. Appl. No. 16/478,366 Notice of Allowance issued Mar. 22, 2022.
First Office Action for U.S. Appl. No. 16/478,395 dated Nov. 12, 2021.
Second Office Action for U.S. Appl. No. 16/478,366 dated Apr. 1, 2022.
Second Office Action issued on Jun. 6, 2023 for application No. EP18899019.6.
Decision of Refusal issued on Jul. 10, 2023 for application No. JP2019-566817 with English translation.
First Office Action issued on Oct. 5, 2022 for U.S. Appl. No. 17/844,899.
Hearing Notice dated Jan. 22, 2024 issued in corresponding Indian Application No. 201947052310.
Notice of Grant dated Jan. 29, 2024 issued in corresponding Japanese Application No. 2019-566817.
Office Action dated Dec. 20, 2023 issued in corresponding U.S. Appl. No. 18/306,723.
Office Action dated Jan. 19, 2024 issued in corresponding U.S. Appl. No. 18/342,953.
European First Office Action dated Jan. 17, 2023 corresponding to application No. 18899019.6-1207.
Japanese First Office Action dated Dec. 5, 2022 corresponding to application No. 2019-566817.
United States of America First Office Action dated Dec. 21, 2022 corresponding to U.S. Appl. No. 17/880,790.
Office Action issued on Apr. 3, 2025 for U.S. Appl. No. 18/797,976.
First Office Action dated Mar. 31, 2020, for corresponding Chinese application 201810552885.4.
First Office Action dated Mar. 16, 2020, for corresponding Chinese application 201810151627.5.
Indian First Office Action dated Feb. 26, 2021 corresponding to application No. 201947052310.

* cited by examiner

SHIFT REGISTER UNIT, GATE DRIVING CIRCUIT, DISPLAY DEVICE AND DRIVING METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This is a National Phase Application filed under 35 U.S.C. 371 as a national stage of PCT/CN2018/123947, filed Dec. 26, 2018, an application claiming the benefit of Chinese Application No. 201810552885.4, filed May 31, 2018 and Chinese Application No. 201810151627.5, filed Feb. 14, 2018, the content of each of which is hereby incorporated by reference in its entirety.

TECHNICAL FIELD

Embodiments of the present disclosure relate to a shift register unit, a gate driving circuit, a display device and a driving method.

BACKGROUND

In the display field, especially in an OLED (Organic Light-Emitting Diode) display panel, a gate driving circuit is currently integrated in a GATE IC. In an IC design, an area of a chip is a main factor affecting the cost of the chip, and how to effectively reduce the area of the chip is a major consideration for technical developers.

SUMMARY

At least one embodiment of the present disclosure provides a shift register unit including a blanking input circuit, a display input circuit, an output circuit, and a compensation selection circuit. The blanking input circuit is configured to [input a blanking input signal to a control node and to] input a blanking signal to a first node during a blanking period of a frame; the display input circuit is configured to input a display signal to the first node in a display period of the frame in response to a display input signal; the output circuit is configured to output a composite output signal to an output terminal under the control of a level of the first node; the compensation selection circuit is electrically coupled to the output terminal and configured to charge [the] *a* control node with the composite output signal in response to a compensation selection control signal.

For example, in the shift register unit provided in an embodiment of the present disclosure, the composite output signal includes a first output signal and a second output signal, and in the display period of the frame, the output circuit is configured to output the first output signal to the output terminal under the control of the level of the first node; in the blanking period of the frame, the output circuit is configured to output the second output signal to the output terminal under the control of the level of the first node.

*For example, in the shift register unit provided in an embodiment of the present disclosure, the shift register unit further includes a twenty-first transistor and a fourth leakage prevention transistor, which are configured to prevent leakage of charges at the first node;*

*the blanking input circuit includes an isolation sub-circuit configured to input the blanking signal to the first node under the control of a level of the control node and a first clock signal; the isolation sub-circuit includes a third transistor and a fourth transistor, a gate of the third transistor is coupled to the control node, a first electrode of the third transistor receives the blanking signal, a second electrode of the of the third transistor is coupled to a first electrode of the fourth transistor, a gate of the fourth transistor is coupled to a first clock signal terminal to receive a first clock signal, and a second electrode of the fourth transistor is coupled to a first electrode of the fourth leakage prevention transistor, a gate of the fourth leakage prevention transistor is coupled to the first clock signal terminal to receive the first clock signal, and a second electrode of the fourth leakage prevention transistor is coupled to the first node; a first electrode of the twenty-first transistor is coupled to a second voltage terminal, a gate of the twenty-first transistor is coupled to the first node, and a second electrode of the twenty-first transistor is coupled to the first electrode of the fourth leakage prevention transistor.*

For example, in the shift register unit provided in an embodiment of the present disclosure, in the display period of the frame, the compensation selection circuit is configured to charge the control node with the first output signal in response to the compensation selection control signal.

For example, in the shift register unit provided in an embodiment of the present disclosure, the output terminal includes a shift signal output terminal that outputs the composite output signal, and the compensation selection circuit includes a first transistor; a gate of the first transistor is coupled to a compensation selection control terminal to receive the compensation selection control signal, a first electrode of the first transistor is coupled to the shift signal output terminal to receive the composite output signal, and a second electrode of the first transistor is coupled to the control node.

For example, in the shift register unit provided in an embodiment of the present disclosure, the blanking input circuit *further* includes: a charging sub-circuit configured to input the blanking input signal to the control node in response to a second clock signal; a storage sub-circuit configured to store the blanking input signal input by the charging sub-circuit[; an isolation sub-circuit configured to input the blanking signal to the first node under the control of a level of the control node and a first clock signal.].

For example, in the shift register unit provided in an embodiment of the present disclosure, the charge sub-circuit includes a second transistor, a gate of the second transistor is coupled to a second clock signal terminal to receive the second clock signal, a first electrode of the second transistor is coupled to a blanking input signal terminal to receive the blanking input signal, and a second electrode of the second transistor is coupled to the control node; the storage sub-circuit includes a first capacitor, a first electrode of the first capacitor is coupled to the control node, and a second electrode of the first capacitor is coupled to a first voltage terminal to receive a first voltage[; the isolation sub-circuit includes a third transistor and a fourth transistor, wherein a gate of the third transistor is coupled to the control node, a first electrode of the third transistor is coupled to a third clock signal terminal to receive a third clock signal as the blanking signal, a second electrode of the third transistor is coupled to a first electrode of the fourth transistor, a gate of the fourth transistor is coupled to the first clock signal terminal to receive the first clock signal, and a second electrode of the fourth transistor is coupled to the first node.].

For example, in the shift register unit provided in an embodiment of the present disclosure, the display input circuit includes a fifth transistor, a gate of the fifth transistor is coupled to a display input signal terminal to receive the display input signal, a first electrode of the fifth transistor is coupled to a second voltage terminal to receive a second voltage as the display signal, and a second electrode of the fifth transistor is coupled to the first node.

For example, in the shift register unit provided in an embodiment of the present disclosure, the output terminal further includes a pixel signal output terminal, the pixel signal output terminal outputs the composite output signal, and the output circuit includes a sixth transistor, a seventh transistor, and a second capacitor, a gate of the sixth transistor is coupled to the first node, a first electrode of the sixth transistor is coupled to a fourth clock signal terminal to receive a fourth clock signal as the composite output signal, and a second electrode of the sixth transistor is coupled to the shift signal output terminal; a gate of the seventh transistor is coupled to the first node, a first electrode of the seventh transistor is coupled to the fourth clock signal terminal to receive the fourth clock signal as the composite output signal, and a second electrode of the seventh transistor is coupled to the pixel signal output terminal; a first electrode of the second capacitor is coupled to the first node, and a second electrode of the second capacitor is coupled to the second electrode of the sixth transistor.

For example, the shift register unit provided in an embodiment of the present disclosure further includes a noise reduction circuit and a first control circuit. The output terminal further includes a pixel signal output terminal, and the pixel signal output terminal outputs the composite output signal; the first control circuit is configured to control a level of a second node under the control of the level of the first node; the noise reduction circuit is configured to reduce noise of the first node, the shift signal output terminal, and the pixel signal output terminal under the control of the level of the second node.

For example, in the shift register unit provided in an embodiment of the present disclosure, the first control circuit includes an eighth transistor, a ninth transistor, and a tenth transistor, a gate and a first electrode of the eighth transistor are coupled together and configured to be coupled to a fourth voltage terminal to receive a fourth voltage, a second electrode of the eighth transistor is coupled to the second node; a gate and a first electrode of the ninth transistor are coupled together and configured to be coupled to a fifth voltage terminal to receive a fifth voltage, a second electrode of the ninth transistor is coupled to the second node; a gate of the tenth transistor is coupled to the first node, a first electrode of the tenth transistor is coupled to the second node, and a second electrode of the tenth transistor is coupled to the first voltage terminal to receive the first voltage.

For example, in the shift register unit provided in an embodiment of the present disclosure, the noise reduction circuit includes an eleventh transistor, a twelfth transistor, and a thirteenth transistor, a gate of the eleventh transistor is coupled to the second node, a first electrode of the eleventh transistor is coupled to the first node, and a second electrode of the eleventh transistor is coupled to the first voltage terminal to receive the first voltage; a gate of the twelfth transistor is coupled to the second node, a first electrode of the twelfth transistor is coupled to the shift signal output terminal, and a second electrode of the twelfth transistor is coupled to the first voltage terminal to receive the first voltage; a gate of the thirteenth transistor is coupled to the second node, a first electrode of the thirteenth transistor is coupled to the pixel signal output terminal, and a second electrode of the thirteenth transistor is coupled to a third voltage terminal to receive a third voltage.

For example, the shift register unit provided in an embodiment of the present disclosure further includes a second control circuit. The second control circuit is configured to control the level of the second node in response to a blanking control signal.

For example, in the shift register unit provided in an embodiment of the present disclosure, the second control circuit includes a fourteenth transistor, and the blanking control signal includes a first clock signal; a gate of the fourteenth transistor is coupled to a first clock signal terminal to receive the first clock signal, a first electrode of the fourteenth transistor is coupled to the second node, and a second electrode of the fourteenth transistor is coupled to a first voltage terminal to receive the first voltage.

For example, the shift register unit provided in an embodiment of the present disclosure further includes a third control circuit. The third control circuit is configured to control the level of the second node in response to a display control signal.

For example, in the shift register unit provided in an embodiment of the present disclosure, the third control circuit includes a fifteenth transistor, and the display control signal includes the display input signal; a gate of the fifteenth transistor is coupled to a display input signal terminal to receive the display input signal, a first electrode of the fifteenth transistor is coupled to the second node, and a second electrode of the fifteenth transistor is coupled to a first voltage terminal to receive a first voltage.

For example, the shift register unit provided in an embodiment of the present disclosure further includes a blanking reset circuit, wherein the blanking reset circuit is configured to reset the first node in response to a blanking reset signal.

For example, in the shift register unit provided in an embodiment of the present disclosure, the blanking reset circuit includes a sixteenth transistor, a gate of the sixteenth transistor is coupled to the second clock signal terminal to receive the second clock signal as the blanking reset signal, a first electrode of the sixteenth transistor is coupled to the first node, and a second electrode of the sixteenth transistor is coupled to the first voltage terminal to receive the first voltage.

For example, the shift register unit provided in an embodiment of the present disclosure further includes a display reset circuit, and the display reset circuit is configured to reset the first node in response to a display reset signal.

For example, in the shift register unit provided in an embodiment of the present disclosure, the display reset circuit includes a seventeenth transistor, a gate of the seventeenth transistor is coupled to a display reset signal terminal to receive the display reset signal, a first electrode of the seventeenth transistor is coupled to the first node, and a second electrode of the seventeenth transistor is coupled to a first voltage terminal to receive a first voltage.

At least one embodiment of the present disclosure further provides a gate driving circuit including a plurality of shift register units, which are cascaded, and each of the shift register units is the shift register unit as above.

For example, the gate driving circuit provided by an embodiment of the present disclosure further includes a first sub-clock signal line, a second sub-clock signal line, a third sub-clock signal line, and a fourth sub-clock signal line, in a case where the shift register unit includes a fourth clock signal terminal, the fourth clock signal terminal of the shift register unit of the $(4n-3)^{th}$ stage is coupled to the first sub-clock signal line; the fourth clock signal terminal of the shift register unit of the $(4n-2)^{th}$ stage is coupled to the second sub-clock signal line; the fourth clock signal terminal of the shift register unit of the $(4n-1)^{th}$ stage is coupled to the third sub-clock signal line; the fourth clock signal terminal of the shift register unit of the $(4n)^{th}$ stage is coupled to the fourth sub-clock signal line, where n is an integer greater than 0.

For example, the gate driving circuit provided in an embodiment of the present disclosure further includes a fifth sub-clock signal line and a sixth sub-clock signal line; in a case where the shift register unit includes a second clock signal terminal and a third clock signal terminal, the second clock signal terminal of the shift register unit of the $(2n-1)^{th}$ stage is coupled to the fifth sub-clock signal line, and the third clock signal terminal of the shift register unit of the $(2n-1)^{th}$ stage is coupled to the sixth sub-clock signal line; the second clock signal terminal of the shift register unit of the $(2n)^{th}$ stage is coupled to the sixth sub-clock signal line, and the third clock signal terminal is coupled to the fifth sub-clock signal line, where n is an integer greater than 0.

For example, in the gate driving circuit provided in an embodiment of the present disclosure, in a case where the shift register unit includes a blanking input signal terminal, a display input signal terminal, and a shift signal output terminal, the blanking input signal terminal of the shift register unit of the $(n+1)^{th}$ stage is coupled to the shift signal output terminal of the shift register unit of the $n^{th}$ stage; the display input signal terminal of the shift register unit of the $(n+2)^{th}$ stage is coupled to the shift signal output terminal of the shift register unit of the $n^{th}$ stage, where n is an integer greater than 0.

At least one embodiment of the present disclosure further provides a display device including any one of the gate driving circuits provided in the embodiments of the present disclosure.

At least one embodiment of the present disclosure further provides a driving method of a shift register unit, including:

a display period of a frame, including: a first input stage in which the display input circuit inputs the display signal to the first node in response to the display input signal; a first output stage in which the output circuit outputs a first output signal under the control of the level of the first node;

a blanking period of the frame, including: a second input stage in which the blanking input circuit inputs the blanking input signal to the control node and the blanking signal to the first node; a second output stage in which the output circuit outputs a second output signal under the control of the level of the first node; where the composite output signal comprises a first output signal and a second output signal.

For example, the driving method provided in an embodiment of the present disclosure further includes: the compensation selection circuit charges the control node with the first output signal in response to the compensation selection control signal during a display period of the frame.

At least one embodiment of the present disclosure further provides a driving method of a gate driving circuit, including: when the gate driving circuit drives a display panel, in a display period of any frame, the output terminal of the shift register unit of the $n^{th}$ stage outputs a first output signal, and the compensation selection circuit in the shift register unit of the $n^{th}$ stage charges the control node in the shift register unit of the $n^{th}$ stage by using the first output signal in response to the compensation selection control signal; in a blanking period of the frame, the output terminal of the shift register unit of the $n^{th}$ stage outputs a second output signal; where the composite output signal includes the first output signal and the second output signal, and n is an integer greater than 0.

BRIEF DESCRIPTION OF THE DRAWINGS

To more clearly illustrate the technical solutions of the embodiments of the present disclosure, the drawings of the embodiments will be briefly described below, and it should be apparent that the drawings described below only relate to some embodiments of the present disclosure and are not limitation on the present disclosure.

To more clearly illustrate the technical solutions of the embodiments of the present disclosure, the drawings of the embodiments will be briefly introduced below, and it should be apparent that the drawings described below only relate to some embodiments of the present disclosure and are not limitation on the present disclosure.

DETAILED DESCRIPTION

Figure 1:
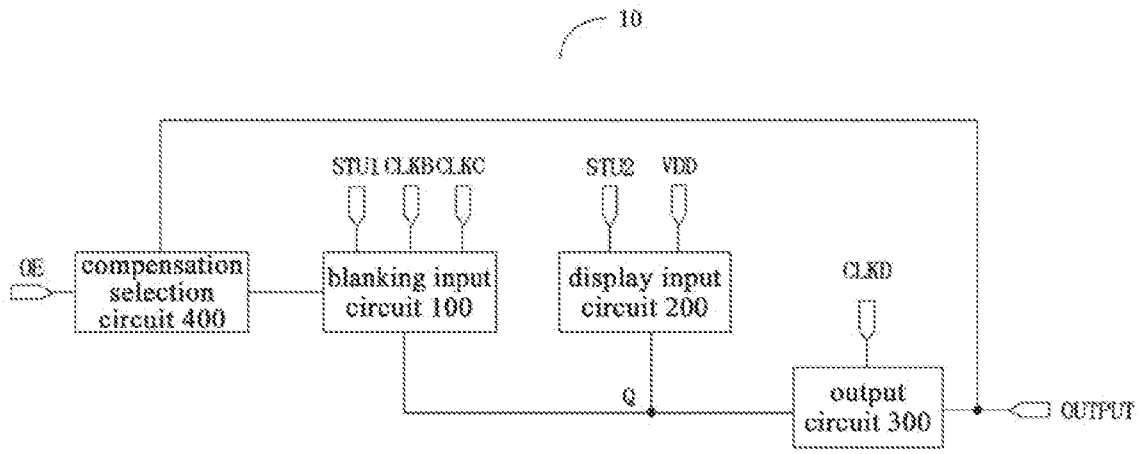
FIG. 1 is a schematic diagram of a shift register unit according to at least one embodiment of the present disclosure.

In order to make the objects, technical solutions and advantages of the embodiments of the present disclosure more apparent, the technical solutions of the embodiments of the present disclosure will be described clearly and completely with reference to the drawings of the embodiments of the present disclosure. Apparently, the described embodiments are only some embodiments of the present disclosure, but not all embodiments. All other embodiments, which can be derived by a person skilled in the art from the described embodiments of the disclosure without any creative labor, are within the scope of protection of the disclosure.

Unless otherwise defined, technical or scientific terms used herein shall have the ordinary meaning as understood by one of ordinary skill in the art to which this disclosure belongs. The use of "first", "second", and similar terms in the present disclosure is not intended to indicate any order, quantity, or importance, but rather is used to distinguish one element from another. Also, the use of the terms "a", "an", or "the" and similar words do not denote a limitation of quantity, but rather denote the presence of at least one. The word "comprising", "comprises", and the like mean that the element or item listed before the word covers the element or item listed after the word and its equivalents, but does not exclude other elements or items. The terms "coupled" or "connected" and the like are not restricted to physical or mechanical connections, but may include electrical connections, whether direct or indirect. Words "upper", "lower", "left", "right", and the like are used merely to indicate relative positional relationships, and when an absolute position of an object being described is changed, the relative positional relationships may also be changed accordingly.

In the embodiments of the present disclosure, for example, in a case where the respective circuits are implemented as N-type transistors, the term "pull-up" means charging a node or an electrode of a transistor such that an absolute value of a level of the node or the electrode is raised, thereby implementing an operation (e.g., turning on) of the corresponding transistor; "pull-down" means discharging a node or an electrode of a transistor so that an absolute value of a level of the node or the electrode is lowered, thereby achieving an operation (e.g., turning off) of the corresponding transistor.

For another example, in a case where the respective circuits are implemented as P-type transistors, the term "pull-up" means discharging a node or an electrode of a transistor such that an absolute value of a level of the node or the electrode is lowered, thereby implementing an operation (e.g., turning on) of the corresponding transistor; "pull down" means charging a node or an electrode of a transistor such that an absolute value of a level of the node or the electrode is raised, thereby implementing an operation (e.g., turning off) of the corresponding transistor.

Also, specific meanings of the terms "pull-up" and "pull-down" will be adjusted accordingly depending on a specific type of transistor employed, as long as control of the transistor can be achieved to achieve a corresponding switching function.

At present, a gate driving circuit for an OLED is usually formed by combining three sub-circuits, namely a detection circuit, a display circuit and a connection circuit (or gate circuit) for outputting a composite pulse of the detection circuit and the display circuit, and such a circuit structure is very complex and cannot meet the requirements for high resolution and narrow bezel.

In a case where a compensation is performed on a sub-pixel unit in the OLED display panel, in addition to an internal compensation by providing a pixel compensation circuit in the sub-pixel unit, an external compensation may be performed by providing sensing transistors. When performing the external compensation, the gate driving circuit constituted by the shift register units needs to supply driving signals for scanning transistors and the sensing transistors, for example, scanning driving signals for the scanning transistors supplied n a display period (Display) of one frame, and sensing driving signals for the sensing transistors in a blanking period (Blank) of the frame, to the sub-pixel units in the display panel, respectively.

In one external compensation method, the sensing driving signals output by the gate driving circuit are used to sequentially scan row-by-row, for example, the sensing driving signal for the sub-pixel units of a first row in the display panel is output in the blanking period of a first frame, the sensing driving signal for the sub-pixel units of a second row in the display panel is output in a blanking period of a second frame, and so on, thus the sensing driving signals are sequentially output row-by-row at a frequency that one sensing driving signal corresponding to the sub-pixel units of one row is output per frame, that is, the progressive sequential compensation for the display panel is completed.

However, in a case where the above row-by-row sequential compensation method is adopted, there is a possibility that a display failure problem occurs: firstly, a scanning line moving row-by-row occurs in the process of scanning and displaying multiple frames; secondly, a difference of time points of performing the external compensation may cause brightness difference of different areas of the display panel to be relatively large, for example, when the externally compensation is performed on the sub-pixel units of the 100th row of the display panel, although the externally compensation has been already performed on the sub-pixel units of the 10th row of the display panel, the light emitting brightness of the sub-pixel units of the 10th row may have been changed, for example, the brightness is reduced, so that the brightnesses of different areas of the display panel may be de-uniform, and thus such a problem may be more obvious in a large-sized display panel.

In view of the above problems, at least one embodiment of the present disclosure provides a shift register unit including a blanking input circuit, a display input circuit, an output circuit, and a compensation selection circuit. The blanking input circuit is configured to input a blanking input signal to a control node and to input a blanking signal to a first node during a blanking period of one frame; the display input circuit is configured to input a display signal to the first node in a display period of the frame in response to a display input signal; the output circuit is configured to output a composite output signal to an output terminal under the control of a level of the first node; the compensation selection circuit is electrically coupled with the output terminal and is configured to charge the control node by utilizing the composite output signal in response to a compensation selection control signal. The embodiments of the present disclosure also provide a gate driving circuit, a display device and a driving method corresponding to the shift register unit.

The shift register unit, the gate driving circuit, the display device and the driving method provided by the embodiments of the present disclosure can also realize a random compensation on the premise of considering the progressive sequential compensation (for example, the progressive sequential compensation is required in a shutdown detection), so that the display defects such as scanning line and de-uniform display brightness caused by the progressive sequential compensation can be avoided.

It should be noted that, in the embodiments of the present disclosure, the random compensation refers to an external compensation method different from the progressive sequential compensation method, and the sensing driving signal corresponding to the sub-pixel units of any row of the display panel can be randomly output in the blanking period of a certain frame, the following embodiments are the same as above, and are not described again.

In addition, in the embodiments of the present disclosure, "one frame", "each frame", or "a certain frame" includes a display period and a blanking period that are sequentially performed, for example, in the display period, the gate driving circuit outputs a display output signal that can drive the display panel to complete scanning and displaying of a complete image from the first row to the last row, and in the blanking period, the gate driving circuit outputs a blanking output signal that can be used to drive the sensing transistor in a certain row of sub-pixel units in the display panel to complete the external compensation of the certain row of sub-pixel units.

Embodiments of the present disclosure and examples thereof are described in detail below with reference to the accompanying drawings.

At least one embodiment of the present disclosure provides a shift register unit 10, as shown in FIG. 1, the shift register unit 10 includes a blanking input circuit 100, a display input circuit 200, an output circuit 300, and a compensation selection circuit 400. The blanking input circuit 100, the display input circuit 200, and the output circuit 300 are coupled together through a first node Q.

The blanking input circuit 100 is configured to input a blanking input signal to a control node H (not shown in FIG. 1, see FIG. 2) and to input a blanking signal to the first node Q in a blanking period of one frame.

In some embodiments, the blanking input circuit 100 may be coupled to a blanking input signal terminal STU1 and a second clock signal terminal CLKB, so that the blanking input signal input from the blanking input signal terminal STU1 may be input to the control node H under the control of a second clock signal input from the second clock signal terminal CLKB. The blanking input circuit 100 may also be coupled to the third clock signal terminal CLKC so that a third clock signal input from the third clock signal terminal CLKC is input to the first node Q as a blanking signal in a blanking period of one frame, thereby pulling up a potential of the first node Q to an operating potential.

For example, the blanking input circuit 100 may receive and store the blanking input signal in a display period of one frame, and output the blanking signal to the first node Q in accordance with the blanking input signal in the blanking period of this frame, thereby pulling up the potential of the first node Q to the operating potential. For another example, the blanking input circuit 100 may receive and store the blanking input signal in the blanking period of the frame, and output the blanking signal to the first node Q according to the blanking input signal in a blanking period of a next frame, thereby pulling up the potential of the first node Q to the operating potential. The embodiments of the present disclosure are not limited above.

The display input circuit 200 is configured to input a display signal to the first node Q in a display period of one frame in response to a display input signal. For example, in some embodiments, the display input circuit 200 may be coupled to a display input signal terminal STU2 to receive the display input signal, and the display input circuit 200 may be further coupled to a second voltage terminal VDD to receive a second voltage as the display signal. For example, the display input circuit 200 may input the display signal to the first node Q under the control of the display input signal in the display period of the frame, thereby pulling up the potential of the first node Q to the operating potential.

It should be noted that, in the embodiments of the present disclosure, the second voltage terminal VDD is configured to output a DC high level signal, that is, the second voltage is at a high level, and the following embodiments are the same and will not be described again.

The output circuit 300 is configured to output a composite output signal to the output terminal OUTPUT under the control of the level of the first node Q. For example, in some embodiments, the output circuit 300 may be coupled to a fourth clock signal terminal CLKD to receive a fourth clock signal as the composite output signal.

For example, in some embodiments, the composite output signal includes a first output signal and a second output signal, e.g., the first output signal is a display output signal, and the second output signal is a blanking output signal. For example, in the display period of the frame, the output circuit 300 outputs the display output signal to the output terminal OUTPUT under the control of the level of the first node Q, for example, in some embodiments, the output terminal OUTPUT may include a shift signal output terminal CR and a pixel signal output terminal OUT, the display output signal output from the shift signal output terminal CR may be used for scan shift from a previous register unit to a next shift register unit, and the display output signal output from the pixel signal output terminal OUT may be used for driving the sub-pixel units in the display panel to perform scan display; in the blanking period of the frame, the output circuit 300 outputs a blanking output signal, which may be used to drive the sensing transistor, to the output terminal OUTPUT under the control of the level of the first node Q.

The compensation selection circuit 400 is electrically coupled to the output terminal OUTPUT and is configured to charge the control node H by using the composite output signal in response to a compensation selection control signal.

For example, in some embodiments, the compensation selection circuit 400 is configured to charge the control node H with a first output signal (e.g., the display output signal) in response to the compensation selection control signal during the display period of the frame.

For example, in a case where the output terminal OUTPUT includes the shift signal output terminal CR and the pixel signal output terminal OUT, in one example, the compensation selection circuit 400 may be electrically coupled to the shift signal output terminal CR. In some embodiments, the compensation selection circuit 400 may also be coupled to a compensation selection control terminal OE to receive the compensation selection control signal.

For example, when performing the progressive sequential compensation, the compensation selection circuit 400 may be disabled by inputting a signal to turn off the compensation selection circuit 400 through the compensation selection control terminal OE. In another example, when performing the random compensation, in a case where the $n^{th}$ row of sub-pixel units in the display panel needs to be compensated in a certain frame, in the display period of the frame, when the output terminal OUTPUT outputs the display output signal (the composite output signal) for driving the $n^{th}$ row of sub-pixel units, the compensation selection control signal for turning on the compensation selection circuit 400 may be input through the compensation selection control terminal OE, and the compensation selection control signal may be configured to have the same timing as the above-described display output signal for driving the $n^{th}$ row of sub-pixel units; meanwhile, since the compensation selection circuit 400 is electrically coupled to the output terminal OUTPUT, the control node H in the compensation input circuit 100 may be charged with the composite output signal when the compensation selection circuit 400 is turned on, so that the control node H is charged to a high level, and thus the output circuit 300 may output the blanking output signal for driving the sensing transistors in the sub-pixel units of the $n^{th}$ row in the blanking period of the frame.

In some embodiments, the compensation selection control terminal OE may be configured to be electrically coupled to a control circuit, which may provide an electrical signal for turning on or off the compensation selection circuit 400 to the compensation selection control terminal OE. For example, in one example, the control circuit may be implemented as an FPGA (field programmable gate array) device or any other signal generation circuit.

According to the shift register unit 10 provided in the embodiment of the present disclosure, with the compensation selection circuit 400, the random compensation can be achieved on the premise of achieving the progressive sequential compensation, so that display defects such as scanning lines and non-uniformity of display brightness due to progressive sequential compensation can be avoided.

Figure 2:
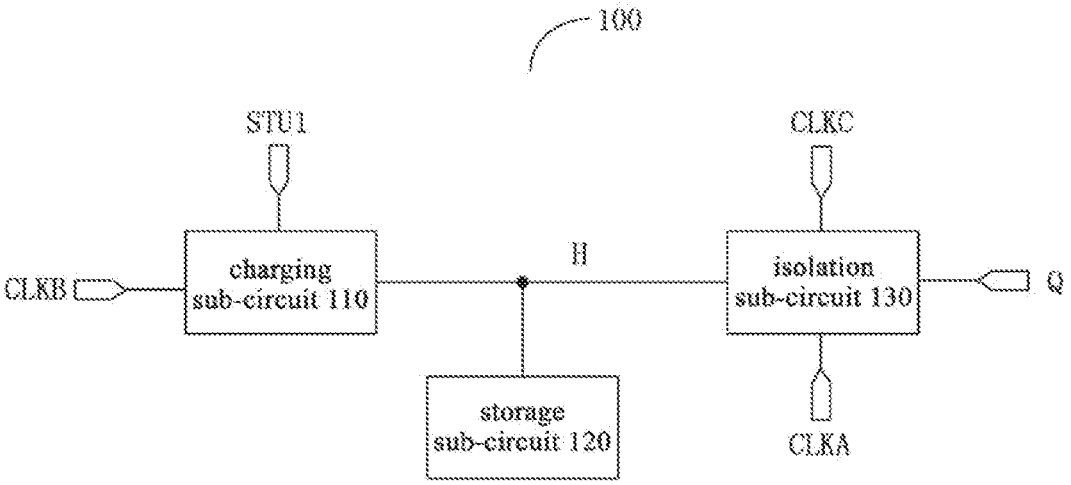
FIG. 2 is a schematic diagram of a blanking input circuit according to at least one embodiment of the present disclosure.

In one example of an embodiment of the present disclosure, as shown in FIG. 2, the blanking input circuit 100 includes a charging sub-circuit 110, a storage sub-circuit 120, and an isolation sub-circuit 130.

The charging sub-circuit 110 is configured to input the blanking input signal to the control node H in response to the second clock signal. For example, the charging sub-circuit 110 is coupled to the blanking input signal terminal STU1 to receive the blanking input signal, and the charging sub-circuit 110 is coupled to the second clock signal terminal CLKB to receive the second clock signal. For example, the charging sub-circuit 110 may be turned on under the control of the second clock signal to input the blanking input signal to the control node H.

The storage sub-circuit 120 is configured to store the blanking input signal input by the charging sub-circuit 110. For example, in the display period of the frame, the control node H is charged to a high level by the input blanking input signal, and the storage sub-circuit 120 may store the blanking input signal so that the high level of the control node H is maintained up to the blanking period of the frame.

The isolation sub-circuit 130 is configured to input the blanking signal to the first node Q under the control of the level of the control node H and the first clock signal. For example, in some embodiments, the isolation sub-circuit 130 is coupled to the first clock signal terminal CLKA to receive the first clock signal, and the isolation sub-circuit 130 is coupled to the third clock signal terminal CLKC to receive the third clock signal as the blanking signal.

For example, in the blanking period of the frame, the isolation sub-circuit 130 is turned on under the control of the level of the control node H and the first clock signal, so that the blanking signal may be input to the first node Q. For another example, in some embodiments, the isolation sub-circuit 130 is disposed between the first node Q and control node H for preventing interaction of the first node Q and the control node H. For example, the isolation sub-circuit 130 may disconnect the first node Q from the control node H when the blanking signal is not required to be output.

According to the shift register unit 10 provided by the embodiments of the present disclosure, it is possible to control the level of the first node Q at different periods through the blanking input circuit 100 and the display input circuit 200 respectively, so that the blanking input circuit 100 and the display input circuit 200 share the same output circuit 300 to realize the output of the composite output signal.

Figure 3:
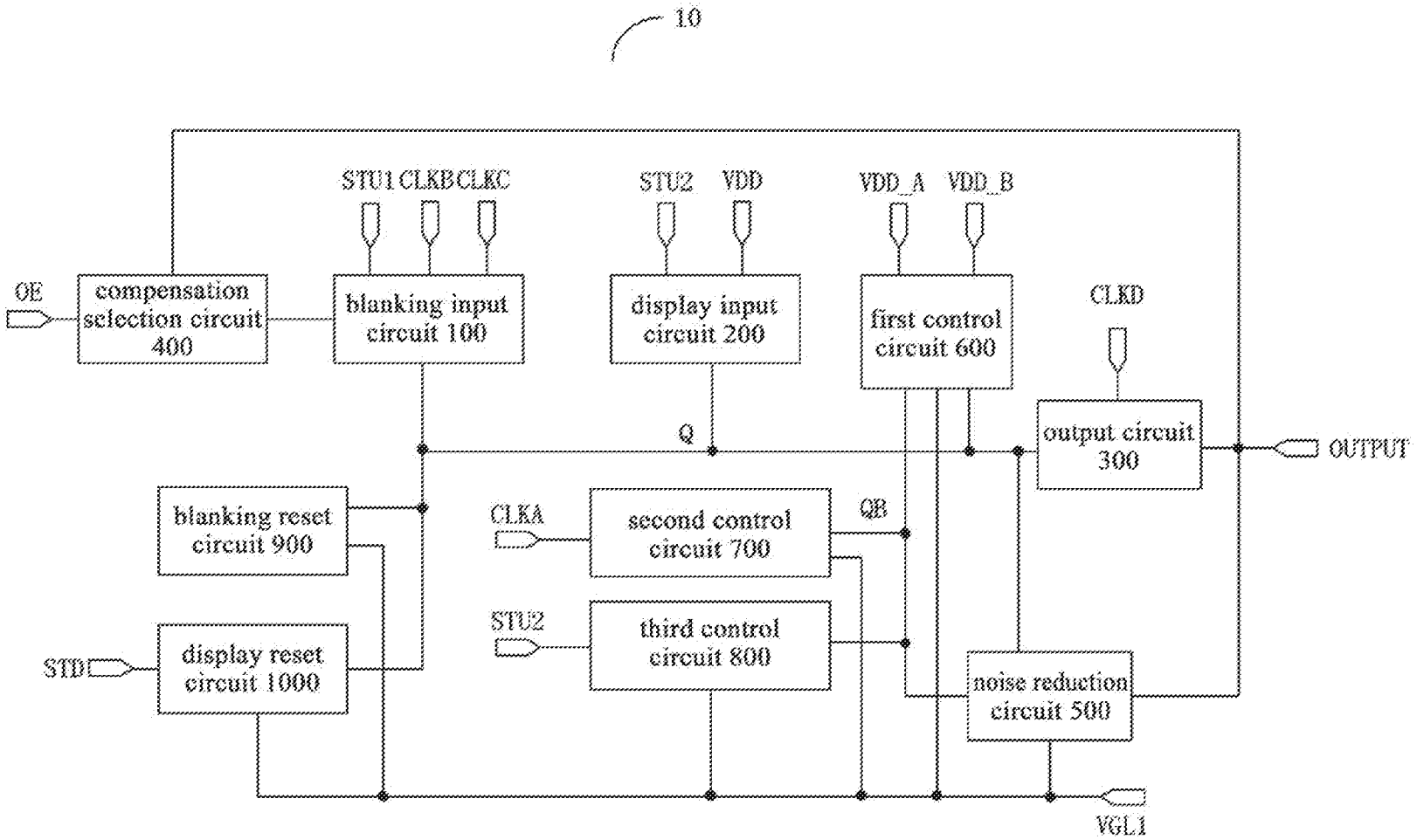
FIG. 3 is a schematic diagram of another shift register unit according to at least one embodiment of the present disclosure.

In some embodiments, as shown in FIG. 3, the shift register unit 10 may further include a first control circuit 600, and the first control circuit 600 is configured to control a level of a second node QB under the control of the level of the first node Q. For example, in one example, the first control circuit 600 is coupled to a first voltage terminal VGL1 and a fourth voltage terminal VDD_A, It should be noted that, in the embodiment of the disclosure, for example, the first voltage terminal VGL1 may be configured to provide a DC low level signal, and the following embodiments are the same and will not be described again.

For example, when the first node Q is at a high level, the first control circuit 600 may pull down a potential of the second node QB to a low level through the first voltage terminal VGL1. For another example, when the potential of the first node Q is at a low level, the first control circuit 600 may charge the second node QB with a fourth voltage (e.g., at a high level) input from the fourth voltage terminal VDD_A to pull up the second node QB to a high level.

In another example, the first control circuit 600 may be further coupled to a fifth voltage terminal VDD_B to receive a fifth voltage (e.g., at a high level), for example, the fourth voltage terminal VDD_A and the fifth voltage terminal VDD_B may be configured to alternately output a high level, that is, when the fourth voltage terminal VDD_A outputs a high level, the fifth voltage terminal VDD_B outputs a low level, and when the fourth voltage terminal VDD_A outputs a low level, the fifth voltage terminal VDD_B outputs a high level.

In some embodiments, as shown in FIG. 3, the shift register unit 10 may further include a noise reduction circuit 500, and the noise reduction circuit 500 is configured to reduce noise of the first node Q and the output terminal OUTPUT under the control of the level of the second node QB. For example, the noise reduction circuit 500 is coupled to the first voltage terminal VGL1, and when the noise reduction circuit 500 is turned on under the control of the level of the second node QB, the first node Q and the Output terminal OUTPUT may be pulled down by the first voltage terminal VGL1, thereby reducing the noise of the first node Q and the output terminal OUTPUT. In a case where the output terminal OUTPUT includes the shift signal output terminal CR and the pixel signal output terminal OUT, the noise reduction circuit 500 may simultaneously perform noise reduction on the shift signal output terminal CR and the pixel signal output terminal OUT.

In some embodiments, as shown in FIG. 3, the shift register unit 10 may further include a second control circuit 700, and the second control circuit 700 is configured to control the level of the second node QB in response to the blanking control signal. For example, in one example, the second control circuit 700 is coupled to the first clock signal terminal CLKA to receive the first clock signal as the blanking control signal, while being coupled to the first voltage terminal VGL1 to receive the first voltage at a low level. For example, in the blanking period of the frame, the second control circuit 700 may be turned on in response to the first clock signal, so that the second node QB may be pulled down by the first voltage terminal VGL1. In this way, the influence of the second node QB on the first node Q in the blanking period can be reduced, so that the blanking input circuit 100 charges the first node Q more sufficiently.

It should be noted that, in the embodiments of the present disclosure, the second control circuit 700 may also be coupled to other signal terminals to receive the blanking control signal, which is not limited by the present disclosure.

In some embodiments, as shown in FIG. 3, the shift register unit 10 may further include a third control circuit 800, and the third control circuit 800 is configured to control the level of the second node QB in response to the display control signal. For example, in one example, the third control circuit 800 is coupled to the display input signal terminal STU2 to receive the display input signal as the display control signal, and is coupled to the first voltage terminal VGL1 to receive the first voltage at the low level. For example, in the display period of the frame, while the display input signal is supplied to the display input circuit 200 to charge the first node Q, the display input signal is also supplied to the third control circuit 800, the third control circuit 800 is turned on, so that the second node QB can be pulled down through the first voltage terminal VGL1. In this way, the influence of the second node QB on the first node Q can be reduced in the display period, so that the first node Q is charged more sufficiently by the display input circuit 200.

It should be noted that, in the embodiments of the present disclosure, the third control circuit 800 may also be coupled to other signal terminals to receive the display control signal, which is not limited by the present disclosure.

In some embodiments, as shown in FIG. 3, the shift register unit 10 may further include a blanking reset circuit 900, and the blanking reset circuit 900 being is configured to reset the first node Q in response to a blanking reset signal. For example, in one example, the blanking reset circuit 900 may be coupled to the second clock signal terminal CLKB to receive the second clock signal as the blanking reset signal, while being coupled to the first voltage terminal VGL1 to receive the first voltage at a low level. For example, before the display period of the frame, the blanking reset circuit 900 may be turned on in response to the second clock signal, so that the first node Q may be reset through the first voltage terminal VGL 1; for another example, in the blanking period of the frame, the blanking reset circuit 900 may be turned on in response to the second clock signal, so that the first node Q may be reset through the first voltage terminal VGL 1.

It should be noted that, in the embodiments of the present disclosure, in addition to the second clock signal, the blanking reset circuit 900 may also use other control signals as the blanking reset signal, for example, the blanking reset circuit 900 may also be coupled to other signal terminals to receive the blanking reset signal, which is not limited by the present disclosure.

In some embodiments, as shown in FIG. 3, the shift register unit 10 may further include a display reset circuit 1000, and the display reset circuit 1000 is configured to reset the first node Q in response to a display reset signal. For example, in one example, the display reset circuit 1000 may be coupled to a display reset signal terminal STD to receive the display reset signal, while being coupled to the first voltage terminal VGL1 to receive the first voltage of the low level. For example, in the display period of the frame, the display reset circuit 1000 may be turned on in response to the display reset signal, so that the first node Q may be reset through the first voltage terminal VGL1. For example, for the shift register unit 10 of the $n^{th}$ stage, the display reset signal terminal STD thereof may be coupled to a shift signal output terminal CR of the shift register unit 10 of a next stage.

It will be understood by those skilled in the art that although the shift register unit 10 in FIG. 3 shows to include the noise reduction circuit 500, the first control circuit 600, the second control circuit 700, the third control circuit 800, the blanking reset circuit 900 and the display reset circuit 1000, the above examples do not limit the scope of the present disclosure. In practical applications, a skilled person may choose to use or not use one or more of the above circuits according to circumstances, and various combined modifications based on the above circuits do not depart from the principle of the present disclosure, and are not described in detail here.

Figure 4:
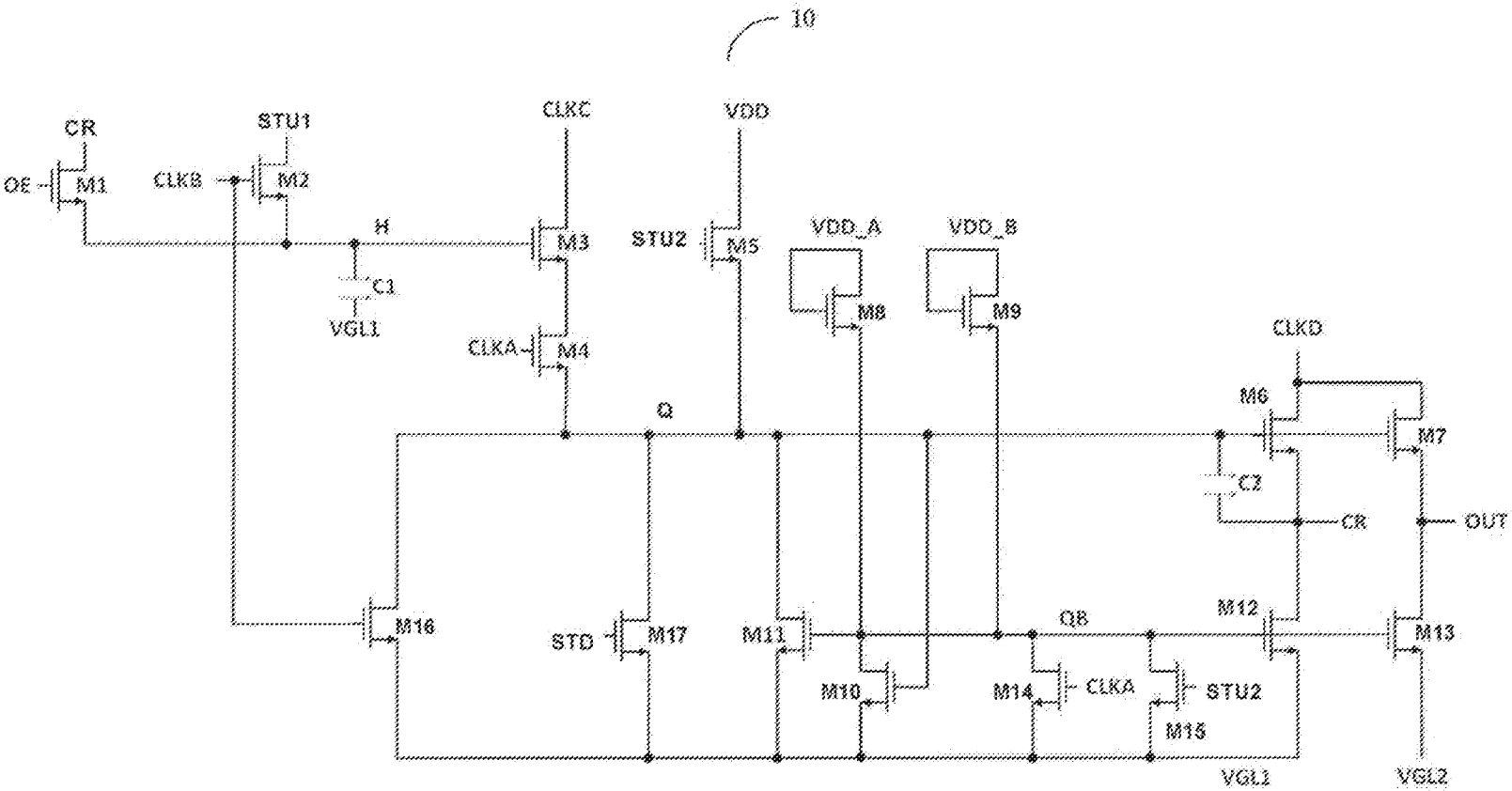
FIG. 4 is a circuit diagram of a shift register unit according to at least one embodiment of the present disclosure.

In one example of the embodiment of the present disclosure, the shift register unit 10 shown in FIG. 3 may be implemented as the circuit configuration shown in FIG. 4. As shown in FIG. 4, the shift register unit 10 includes: first to seventeenth transistors M1-M17 and first and second capacitors C1 and C2. The output terminal OUTPUT includes a shift signal output terminal CR and a pixel signal output terminal OUT, both of which can output a composite output signal. Note that the transistors shown in FIG. 4 are all described by taking N-type transistors as an example.

In the example shown in FIG. 4, in more detail, the compensation selection circuit 400 may be implemented as a first transistor M1. A gate of the first transistor M1 is coupled to the compensation selection control terminal OE to receive the compensation selection control signal, a first electrode of the first transistor M1 is coupled to the shift signal output terminal CR (not shown for simplicity) to receive the composite output signal, and a second electrode of the first transistor M1 is coupled to the control node H to charge the control node H.

As shown in FIG. 4, the charging sub-circuit 110 in the blanking input circuit 100 may be implemented as a second transistor M2, a gate of the second transistor M2 is coupled to the second clock signal terminal CLKB to receive the second clock signal, a first electrode of the second transistor M2 is coupled to the blanking input signal terminal STU1 to receive the blanking input signal, and a second electrode of the second transistor M2 is coupled to the control node H. For example, when the second clock signal is a high-level turn-on signal, the second transistor M2 is turned on under the control of the second clock signal, so that the blanking input signal may be input to the control node H to charge the control node H. For example, when the shift register units 10 shown in FIG. 4 are cascaded to form a gate driving circuit, the blanking input signal terminal STU1 of the shift register unit 10 of the $(n+1)^{th}$ stage may be electrically coupled to the shift signal output terminal CR of the shift register unit 10 of the $n^{th}$ stage, where n is an integer greater than 0.

As shown in FIG. 4, the storage sub-circuit 120 in the blanking input circuit 100 may be implemented as a first capacitor C1, a first electrode of the first capacitor C1 is coupled to the control node H, and a second electrode of the first capacitor C1 is coupled to the first voltage terminal VGL1 to receive the first voltage. The potential of the control node H can be maintained by providing the first capacitor C1, for example, in the display period of the frame, the charging sub-circuit 110 charges the control node H to a high level, and the first capacitor C1 can maintain the high level of the control node H up to the blanking period of the frame.

As shown in FIG. 4, the isolation sub-circuit 130 in the blanking input circuit 100 may be implemented as a third transistor M3 and a fourth transistor M4, a gate of the third transistor M3 is coupled to the control node H, a first electrode of the third transistor M3 is couple to the third clock signal terminal CLKC to receive the third clock signal as the blanking signal, a second electrode of the third transistor M3 is coupled to a first electrode of the fourth transistor M4, a gate of the fourth transistor M4 is coupled to the first clock signal terminal CLKA to receive the first clock signal, and a second electrode of the fourth transistor M4 is coupled to the first node Q. For example, in the blanking period of the frame, the third transistor M3 is turned on under the control of the control node H, and when the first clock signal is a turn-on signal at a high-level, the fourth transistor M4 is turned on under the control of the first clock signal, so that the third clock signal can charge the first node Q through the third transistor M3 and the fourth transistor M4.

As shown in FIG. 4, the display input circuit 200 may be implemented as a fifth transistor M5, a gate of the fifth transistor M5 is coupled to the display input signal terminal STU2 to receive the display input signal, a first electrode of the fifth transistor M5 is coupled to the second voltage terminal VDD to receive the second voltage as the display signal, and a second electrode of the fifth transistor M5 is coupled to the first node Q. For example, in the display period of the frame, the fifth transistor M5 is turned on under the control of the display input signal, thereby charging the first node Q with the second voltage. For example, when the shift register units 10 shown in FIG. 4 are cascaded to form a gate driving circuit, the display input signal terminal STU2 of the shift register unit 10 of the $(n+2)^{th}$ stage may be electrically coupled to the shift signal output terminal CR of the shift register unit 10 of the $(n+1)^{th}$ stage or the $n^{th}$ stage, where n is an integer greater than 0.

As shown in FIG. 4, the output circuit 300 may be implemented to include a sixth transistor M6, a seventh transistor M7, and a second capacitor. A gate of the sixth transistor M6 is coupled to the first node Q, a first electrode of the sixth transistor M6 is coupled to the fourth clock signal terminal CLKD to receive the fourth clock signal as the composite output signal, and a second electrode of the sixth transistor M6 is coupled to the shift signal output terminal CR; a gate of the seventh transistor M7 is coupled to the first node Q, a first electrode of the seventh transistor M7 is coupled to the fourth clock signal terminal CLKD to receive the fourth clock signal as the composite output signal, and a second electrode of the seventh transistor M7 is coupled to the pixel signal output terminal OUT; a first electrode of the second capacitor C2 is coupled to the first node Q, and a second electrode of the second capacitor C2 is coupled to the second electrode of the sixth transistor M6. For example, when the potential of the first node Q is at a high level, the sixth transistor M6 and the seventh transistor M7 are turned on, so that the fourth clock signal can be output to the shift signal output terminal CR and the pixel signal output terminal OUT as the composite output signal.

As shown in FIG. 4, the first control circuit 600 may be implemented to include an eighth transistor M8, a ninth transistor M9, and a tenth transistor M10, A gate and a first electrode of the eighth transistor M8 are coupled together and configured to be coupled to the fourth voltage terminal VDD_A to receive the fourth voltage, and a second electrode of the eighth transistor M8 is coupled to the second node QB; a gate and a first electrode of the ninth transistor M9 are coupled together and configured to be coupled to the fifth voltage terminal VDD_B to receive the fifth voltage, and a second electrode of the ninth transistor M9 is coupled to the second node QB; a gate of the tenth transistor M10 is coupled to the first node Q, a first electrode of the tenth transistor M10 is coupled to the second node QB, and a second electrode of the tenth transistor M10 is configured to be coupled to the first voltage terminal VGL1 to receive the first voltage.

For example, the fourth voltage terminal VDD_A and the fifth voltage terminal VDD_B may be configured to be alternately input with a high level, that is, when the fourth voltage terminal VDD_A is input with the high level, the fifth voltage terminal VDD_B is input with a low level, and when the fourth voltage terminal VDD_A is input with the low level, the fifth voltage terminal VDD_B is input with the high level, that is, only one of the eighth transistor M8 and the ninth transistor M9 is in a turned-on state, so that performance drift caused by long-term turn-on of the transistors may be prevented. When the eighth transistor M8 or the ninth transistor M9 is turned on, the second node QB may be charged by the fourth voltage or the fifth voltage, thereby pulling the potential of the second node QB to the high level. When the potential of the first node Q is at the high level, the tenth transistor M10 is turned on, for example, in terms of transistor design, the tenth transistor M10 and the eighth transistor M8 (or the ninth transistor M9) may be configured (for example, configured for size ratio, threshold voltage, and the like of the two transistor) such that when both the tenth transistor M10 and the eighth transistor M8 (or the ninth transistor M9) are turned on, the level of the second node QB may be pulled down to the low level, which may keep an eleventh transistor M11, a twelfth transistor M12, and a thirteenth transistor M13 being turned off.

As shown in FIG. 4, the pull-down circuit 500 may be implemented to include the eleventh transistor M11, the twelfth transistor M12, and the thirteenth transistor M13. A gate of the eleventh transistor M11 is coupled to the second node QB, a first electrode of the eleventh transistor M11 is coupled to the first node Q, and a second electrode of the eleventh transistor M11 is coupled to the first voltage terminal VGL1 to receive the first voltage; a gate of the twelfth transistor M12 is coupled to the second node QB, a first electrode of the twelfth transistor M12 is coupled to the shift signal output terminal CR, and a second electrode of the twelfth transistor M12 is coupled to the first voltage terminal VGL1 to receive the first voltage; a gate of the thirteenth transistor M13 is coupled to the second node QB, the first electrode of the thirteenth transistor M13 is coupled to the pixel signal output terminal OUT, and a second electrode of the thirteenth transistor M13 is coupled to the third voltage terminal VGL2 to receive the third voltage. It should be noted that, in the embodiments of the present disclosure, for example, the third voltage terminal VGL2 is configured to input a DC low level signal, that is, the third voltage is at the low level, and the following embodiments are the same and are not described again.

For example, when the potential of the second node QB is at the high level, the eleventh transistor M11 and the twelfth transistor M12 are turned on, so that the first node Q and the shift signal output terminal CR may be pulled down by the first voltage terminal VGL1 to reduce noise of the first node Q and the shift signal output terminal CR. Meanwhile, when the potential of the second node QB is at the high level, the thirteenth transistor M13 is also turned on, so that the pixel signal output terminal OUT can be pulled down by the third voltage terminal VGL2 to reduce noise of the pixel signal output terminal OUT.

It should be noted that, in one example, the first voltage and the third voltage may be different, for example, the first voltage is set to −10V, and the third voltage is set to −6V; in another example, the third voltage terminal VGL2 may not be provided, and the second electrode of the thirteenth transistor M13 is coupled to the first voltage terminal VGL1 to receive the first voltage, which is not limited in the embodiments of the present disclosure.

As shown in FIG. 4, the second control circuit 700 may be implemented as a fourteenth transistor M14. A gate of the fourteenth transistor M14 is coupled to the first clock signal terminal CLKA to receive the first clock signal, a first electrode of the fourteenth transistor M14 is coupled to the second node QB, and a second electrode of the fourteenth transistor M14 is coupled to the first voltage terminal VGL1 to receive the first voltage. For example, when the first clock signal is at the high level, the fourteenth transistor M14 is turned on, so that the second node QB can be pulled down by the first voltage terminal VGL 1. In this way, the influence of the second node QB on the first node Q can be reduced in the blanking period of the frame, so that the first node Q is charged more sufficiently by the blanking input circuit 100.

As shown in FIG. 4, the third control circuit 800 may be implemented as a fifteenth transistor M15. A gate of the fifteenth transistor M15 is coupled to the display input signal terminal STU2 to receive the display input signal, a first electrode of the fifteenth transistor M15 is coupled to the second node QB, and a second electrode of the fifteenth transistor M15 is coupled to the first voltage terminal VGL1 to receive the first voltage. For example, when the display input signal is at the high level, the fifteenth transistor M15 is turned on, so that the second node QB can be pulled down by the first voltage terminal VGL1. For example, when the shift register units 10 shown in FIG. 4 are cascaded to form a gate driving circuit, the display input signal terminal STU2 of the shift register unit 10 of the $(n+2)^{th}$ stage may be electrically coupled to the shift signal output terminal CR of the shift register unit 10 of the $(n+1)^{th}$ stage or the $n^{th}$ stage, where n is an integer greater than 0. In this way, the influence of the second node QB on the first node Q can be reduced in the display period of the frame, so that the charging of the first node Q by the display input circuit 200 is more sufficient.

As shown in FIG. 4, the blanking reset circuit 900 may be implemented as a sixteenth transistor M16. A gate of the sixteenth transistor M16 is coupled to the second clock signal terminal CLKB to receive the second clock signal as the blanking reset signal, a first electrode of the sixteenth transistor M16 is coupled to the first node Q, and a second electrode of the sixteenth transistor M16 is coupled to the first voltage terminal VGL1 to receive the first voltage. For example, when the second clock signal is at the high level, the sixteenth transistor M16 is turned on, so that the first node Q may be reset by using the first voltage terminal VGL1.

As shown in FIG. 4, the display reset circuit 1000 may be implemented as a seventeenth transistor M17. A gate of the seventeenth transistor M17 is coupled to the display reset signal terminal STD to receive the display reset signal, a first electrode of the seventeenth transistor M17 is coupled to the first node Q, and a second electrode of the seventeenth transistor M17 is coupled to the first voltage terminal VGL1 to receive the first voltage. For example, when the display reset signal is at the high level, the seventeenth transistor M17 is turned on, so that the first node Q may be reset by using the first voltage terminal VGL1. For example, when the shift register units 10 shown in FIG. 4 are cascaded to form a gate driving circuit, the display reset signal terminal STD of the shift register unit 10 of the $n^{th}$ stage may be coupled to the shift signal output terminal CR of the shift register unit 10 of a next stage.

Figure 5:
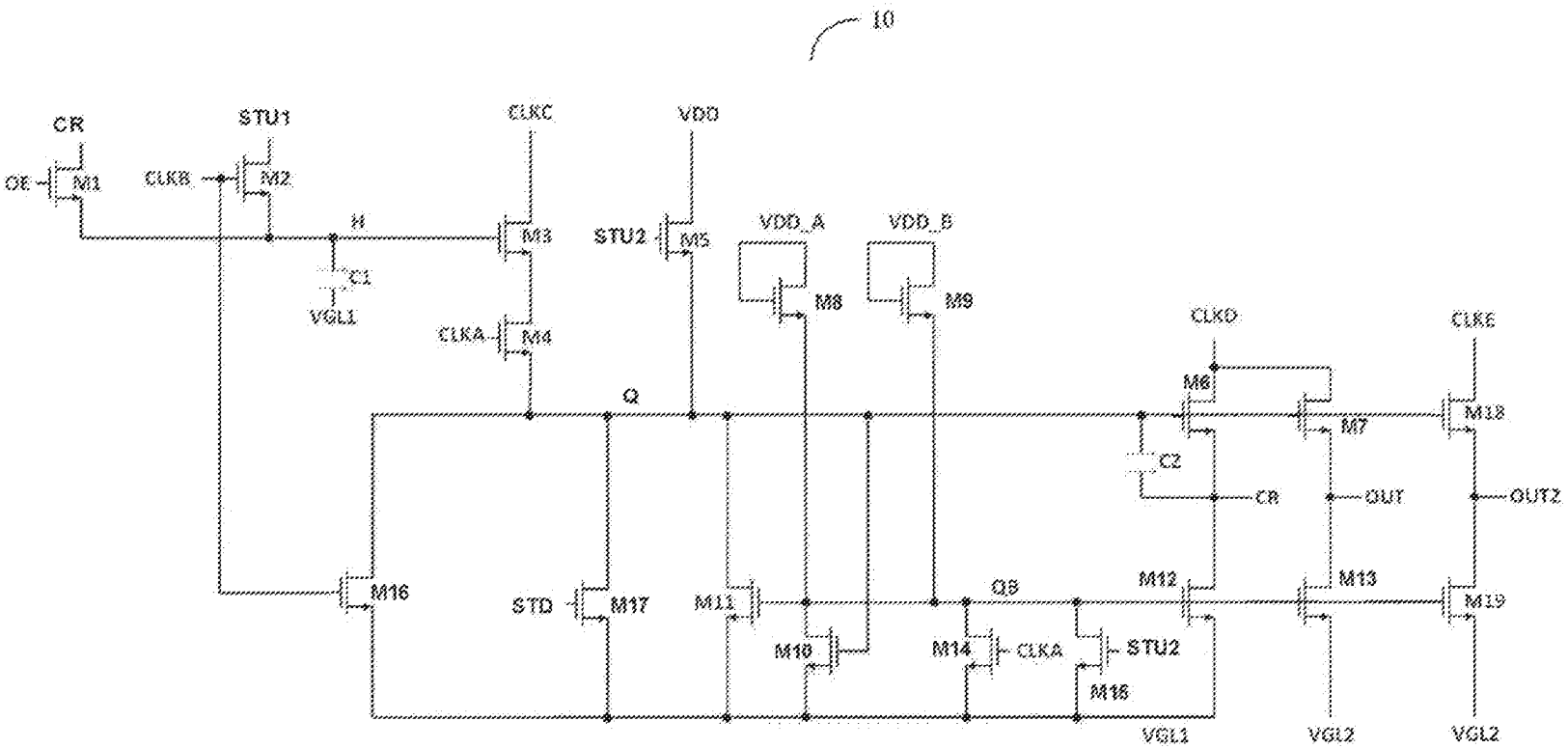
FIG. 5 is a circuit diagram of another shift register unit according to at least one embodiment of the present disclosure.

As shown in FIG. 5, another embodiment of the present disclosure further provides a shift register unit 10, and compared with the shift register unit 10 shown in FIG. 4, the output circuit 300 of the shift register unit 10 shown in FIG. 5 may further include an eighteenth transistor M18, and correspondingly, the noise reduction circuit 500 may further include a nineteenth transistor M19.

As shown in FIG. 5, a gate of the eighteenth transistor M18 is coupled to the first node Q, a first electrode of the eighteenth transistor M18 is coupled to a fifth clock signal terminal CLKE to receive a fifth clock signal, and a second electrode of the eighteenth transistor M18 is coupled to another pixel signal output terminal OUT2. For example, when the potential of the first node Q is at the high level, the eighteenth transistor M18 is turned on, thereby outputting the fifth clock signal to the pixel signal output terminal OUT2. For example, in one example, the fifth clock signal input by the fifth clock signal terminal CLKE may be configured to be the same as the fourth clock signal input by the fourth clock signal terminal CLKD; for another example, in another example, the fifth clock signal may be different from the fourth clock signal, so that the pixel signal output terminals OUT and OUT2 may output different signals, respectively, to improve the driving capability.

As shown in FIG. 5, a gate of the nineteenth transistor M19 is coupled to the second node QB, a first electrode of the nineteenth transistor M19 is coupled to the pixel signal output terminal OUT2, and a second electrode of the nineteenth transistor M19 is coupled to the third voltage terminal VGL2. For example, when the potential of the second node QB is at the high level, the nineteenth transistor M19 is turned on, so that noise reduction of the pixel signal output terminal OUT2 can be performed using the third voltage terminal VGL 2.

Although only the examples of the shift register unit including two and three output terminals are shown above, it can be understood by those skilled in the art that more output terminals may be provided according to the practical situation according to the description of the present disclosure, and the above examples should not be construed as limiting the scope of the present disclosure.

As described above, in the shift register unit 10 provided in the embodiments of the present disclosure, the potential at the control node H may be maintained by the first capacitor C1, and the potential at the first node Q may be maintained by the second capacitor C2. The first capacitor C1 and/or the second capacitor C2 may be implemented by a capacitor device manufactured by a process, for example, by manufacturing dedicated capacitor electrodes, each electrode of the capacitor may be implemented by a metal layer, a semiconductor layer (e.g., doped polysilicon), or the like, or the first capacitor C1 and/or the second capacitor C2 may be implemented by a parasitic capacitor between the devices. The connection mode of the first capacitor C1 and/or the second capacitor C2 is not limited to the above-described mode, and other suitable connection modes may be used as long as the level written into the control node H or the first node Q can be stored. When the potential of the first node Q and/or the control node H are maintained at the high level, there are some transistors (e.g., the first transistor M1, the second transistor M2, the fourth transistor M4, the eleventh transistor M11, the sixteenth transistor M16, and the seventeenth transistor M17) of which first electrodes are coupled to the first node Q and/or the control node H and of which second electrodes each are coupled to a low-level signal terminal. Even when a non-turn-on signal is input to the gates of these transistors, a leakage may occur due to a voltage difference between the first and second electrodes thereof, thereby deteriorating the effect of maintaining the potential of the first node Q and/or the control node H in the shift register unit 10.

For example, as shown in FIG. 4, taking the control node H as an example, the first electrode of the second transistor M2 is coupled to the blanking input signal terminal STU1 and the second electrode of the second transistor M2 is coupled to the control node H. When the control node H is at the high level and the signal input from the blanking input signal terminal STU1 is at the low level, current leakage through the second transistor M2 may occur at the control node H.

Figure 6:
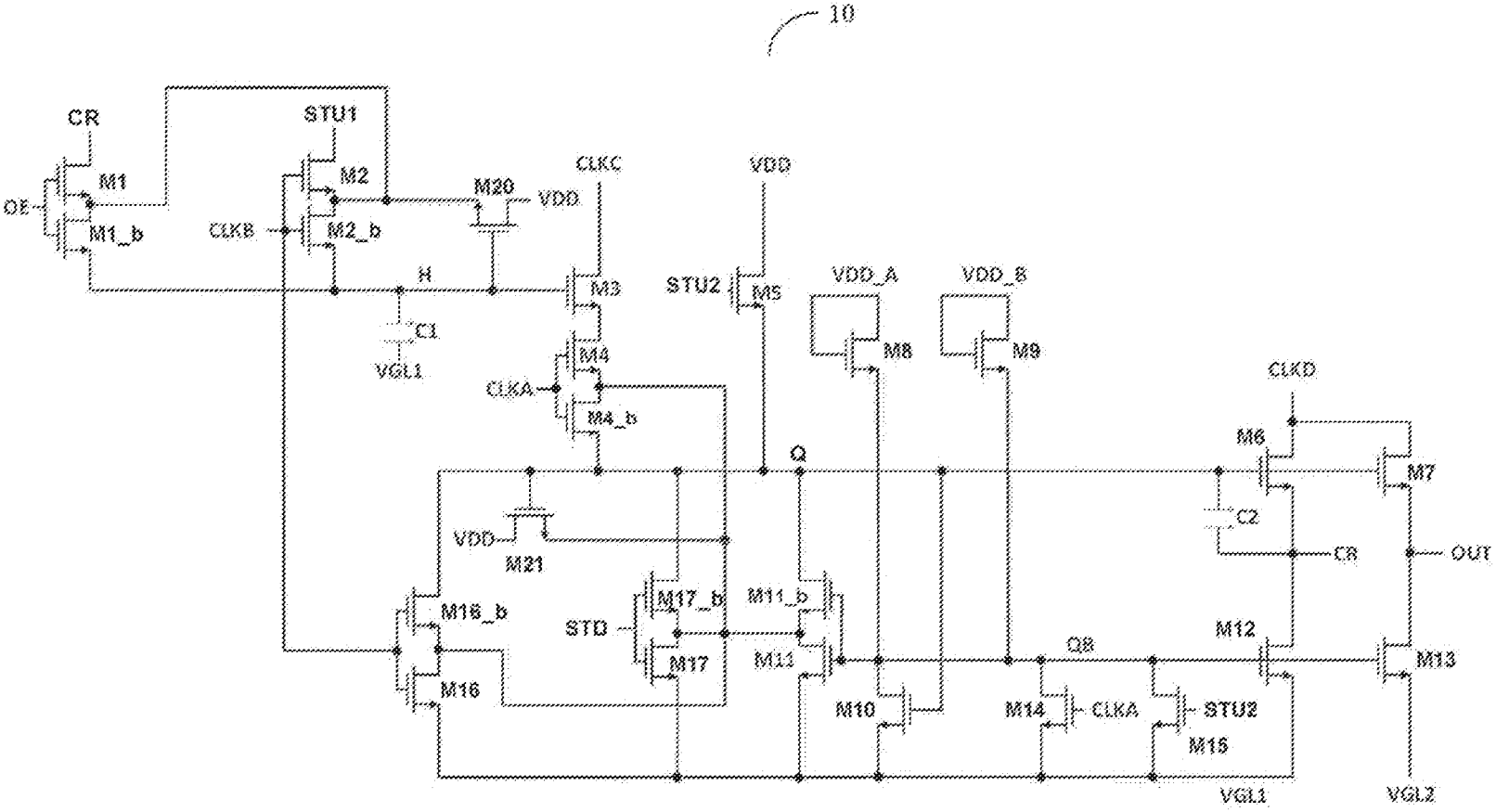
FIG. 6 is a circuit diagram of still another shift register unit according to at least one embodiment of the present disclosure.

In view of the above problem, as shown in FIG. 6, a shift register unit 10 capable of preventing current leakage is provided in an embodiment of the present disclosure. The shift register unit 10 is different from the shift register unit 10 in FIG. 4 in that a first leakage prevention transistor M1_b, a second leakage prevention transistor M2_b, a fourth leakage prevention transistor M4_b, an eleventh leakage prevention transistor M11_b, a sixteenth leakage prevention transistor M16_b, a seventeenth leakage prevention transistor M17_b, a twentieth transistor M20 and a twenty-first transistor M21 are added. The operation principle of the leakage prevention will be described below by taking the second leakage prevention transistor M2_b as an example.

A gate of the second leakage prevention transistor M2_b is coupled to the second clock signal terminal CLKB, a first electrode of the second leakage prevention transistor M2_b is coupled to a second electrode of the twentieth transistor M20, and a second electrode of the second leakage prevention transistor M2_b is coupled to the control node H. A gate of the twentieth transistor M20 is coupled to the control node H, and a first electrode of the twentieth transistor M20 is coupled to the second voltage terminal VDD to receive the second voltage at the high level. When the control node H is at the high level, the twentieth transistor M20 is turned on under the control of the level of the control node H, so that a high level signal input from the second voltage terminal VDD can be input to the first electrode of the second leakage prevention transistor M2_b, thereby causing both the first electrode and the second electrode of the second leakage prevention transistor M2_b to be in the high level state, preventing the charges at the control node H from leaking through the second leakage prevention transistor M2_b. At this time, since the gate of the second leakage prevention transistor M2_b is coupled to the gate of the second transistor M2, combination of the second transistor M2 and the second leakage prevention transistor M2_b can achieve the same effect as the aforementioned second transistor M2 while having a leakage preventing effect.

Similarly, the first leakage prevention transistor M1_b in combination with the twentieth transistor M20 may prevent the charges at the control node H from leaking through the first leakage prevention transistor M1_b and the first transistor M1. Similarly, the fourth leakage prevention transistor M4_b, the eleventh leakage prevention transistor M11_b, the sixteenth leakage prevention transistor M16_b, and the seventeenth leakage prevention transistor M17_b may implement a leakage prevention structure in combination with the twenty-first transistor M21, respectively, so that the leakage of the charge at the first node Q may be prevented. The working principle of preventing the first node Q from leaking is the same as the working principle of preventing the control node H from leaking, and the detailed description is omitted here.

It should be noted that all the transistors used in the embodiments of the present disclosure may be thin film transistors, field effect transistors, or other switching devices with the same characteristics, and all the embodiments of the present disclosure are described by taking thin film transistors as examples. The source and the drain of the transistor used herein may be symmetrical in structure, so that there may be no difference in structure between the source and the drain. In the embodiments of the present disclosure, in order to distinguish two electrodes of a transistor except for the gate, one of them is directly described as the first electrode, and the other is the second electrode. Further, the transistors may be classified into N-type and P-type transistors according to their characteristics. In a case where the transistor is a P-type transistor, the turn-on voltage is a low level voltage (e.g., 0V, −5V, −10V or other suitable voltage), and the turn-off voltage is a high level voltage (e.g., 5V, 10V, or other suitable voltage); in a case where the transistor is an N-type transistor, the turn-on voltage is a high level voltage (e.g., 5V, 10V, or other suitable voltage) and the turn-off voltage is a low level voltage (e.g., 0V, −5V, −10V, or other suitable voltage).

In addition, it should be noted that the transistors used in the shift register unit 10 provided in the embodiments of the present disclosure are all illustrated by taking N-type transistors as examples, the embodiments of the present disclosure include but are not limited to this, for example, at least some of the transistors in the shift register unit 10 may also be P-type transistors.

Figure 7:
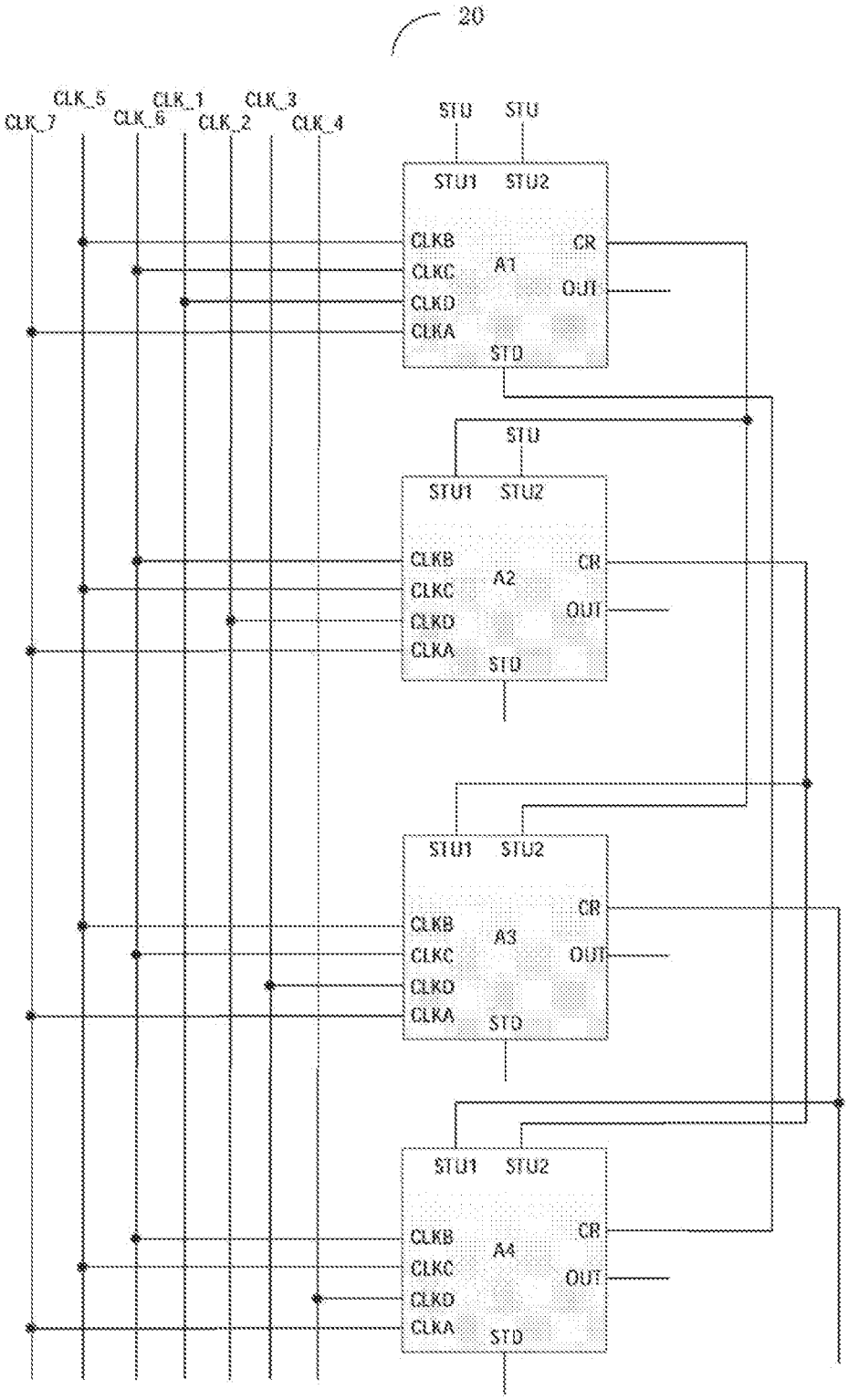
FIG. 7 is a schematic diagram of a gate driving circuit according to at least one embodiment of the present disclosure.

An embodiment of the present disclosure provides a gate driving circuit 20, as shown in FIG. 7, the gate driving circuit 20 includes a plurality of shift register units 10 which are cascaded, where any one or more shift register units 10 may adopt the structure of the shift register unit 10 provided in the embodiments of the present disclosure or a variation thereof. Note that only the front four stages of shift register units (A1, A2, A3, and A4) of the gate driving circuit 20 are schematically shown in FIG. 7.

As shown in FIG. 7, the gate driving circuit 20 further includes a first sub-clock signal line CLK_1, a second sub-clock signal line CLK_2, a third sub-clock signal line CLK_3, and a fourth sub-clock signal line CLK_4. In a case where the shift register unit includes the fourth clock signal terminal CLK_D, the fourth clock signal terminal CLKD of the shift register unit of the $(4n-3)^{th}$ stage is coupled to the first sub-clock signal line CLK_1; the fourth clock signal terminal CLKD of the shift register unit of the $(4n-2)^{th}$ stage is coupled to the second sub-clock signal line CLK_2; the fourth clock signal terminal CLKD of the shift register unit of the $(4n-1)^{th}$ stage is coupled to the third sub-clock signal line CLK_3; the fourth clock signal terminal CLKD of the shift register unit of the $(4n)^{th}$ stage is coupled to the fourth sub-clock signal line CLK_4, where n is an integer greater than 0.

As shown in FIG. 7, the gate driving circuit 20 may further include a fifth sub-clock signal line CLK_5 and a sixth sub-clock signal line CLK_6. In a case where the shift register unit includes the second clock signal terminal CLKB and the third clock signal terminal CLKC, the second clock signal terminal CLKB of the shift register unit of the $(2n-1)^{th}$ stage is coupled to the fifth sub-clock signal line CLK_5, and the third clock signal terminal CLKC is coupled to the sixth sub-clock signal line CLK_6; the second clock signal terminal CLKB of the shift register unit of the $(2n)^{th}$ stage is coupled to the sixth sub-clock signal line CLK_6, the third clock signal terminal CLKC is coupled to the fifth sub-clock signal line CLK_5, where n is an integer greater than 0.

As shown in FIG. 7, the gate driving circuit 20 may further include a seventh sub-clock signal line CLK_7, and the first clock signal terminal CLKA of each stage of the shift register unit is coupled to the seventh sub-clock signal line CLK_7.

As shown in FIG. 7, the blanking input signal terminal STU1 and the display input signal terminal STU2 of the shift register unit of the first stage, and the display input signal terminal STU2 of the shift register unit of the second stage are coupled to the input signal line STU, for example, to receive a trigger signal STV. The blanking input signal terminal STU1 of the shift register unit of the $(n+1)^{th}$ stage, except for the shift register unit of the first stage, is coupled with the shift signal output terminal CR of the shift register unit of the $n^{th}$ stage. The display input signal terminal STU2 of the shift register unit of the $(n+2)^{th}$ stage, except for the shift register units of the first and second stages, is coupled to the shift signal output terminal CR of the shift register unit of the $n^{th}$ stage. The display reset signal terminal STD of the shift register unit of the $n^{th}$ stage, except for the shift register units of the last three stages, is coupled to the shift signal output terminal CR of the shift register unit of the $(n+3)^{th}$ stage, where n is an integer greater than 0.

Figure 8:
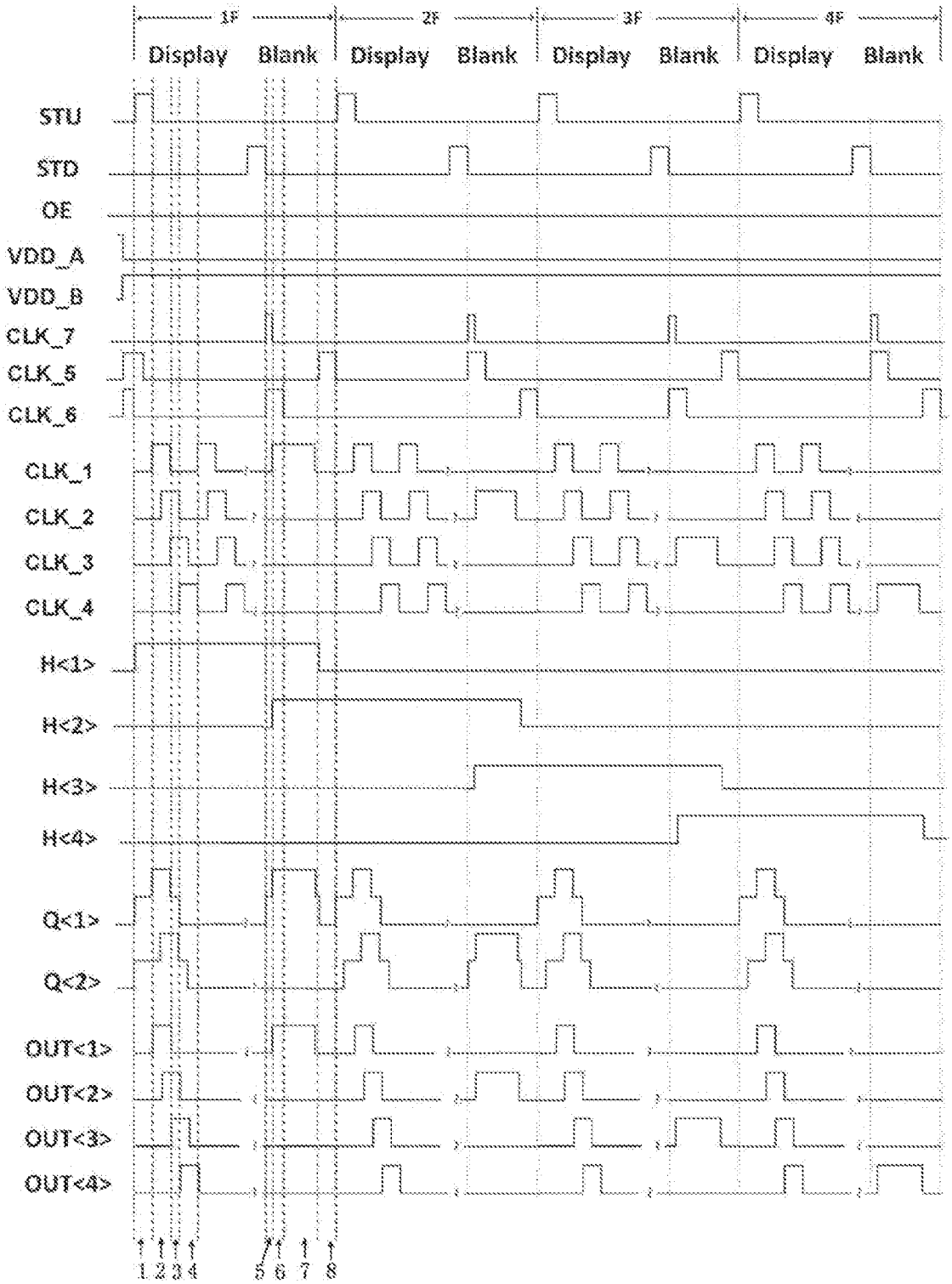
FIG. 8 is a timing diagram of signals for a row-by-row sequential compensation of the gate driving circuit shown in FIG. 7 according to at least one embodiment of the present disclosure.
Figure 9:
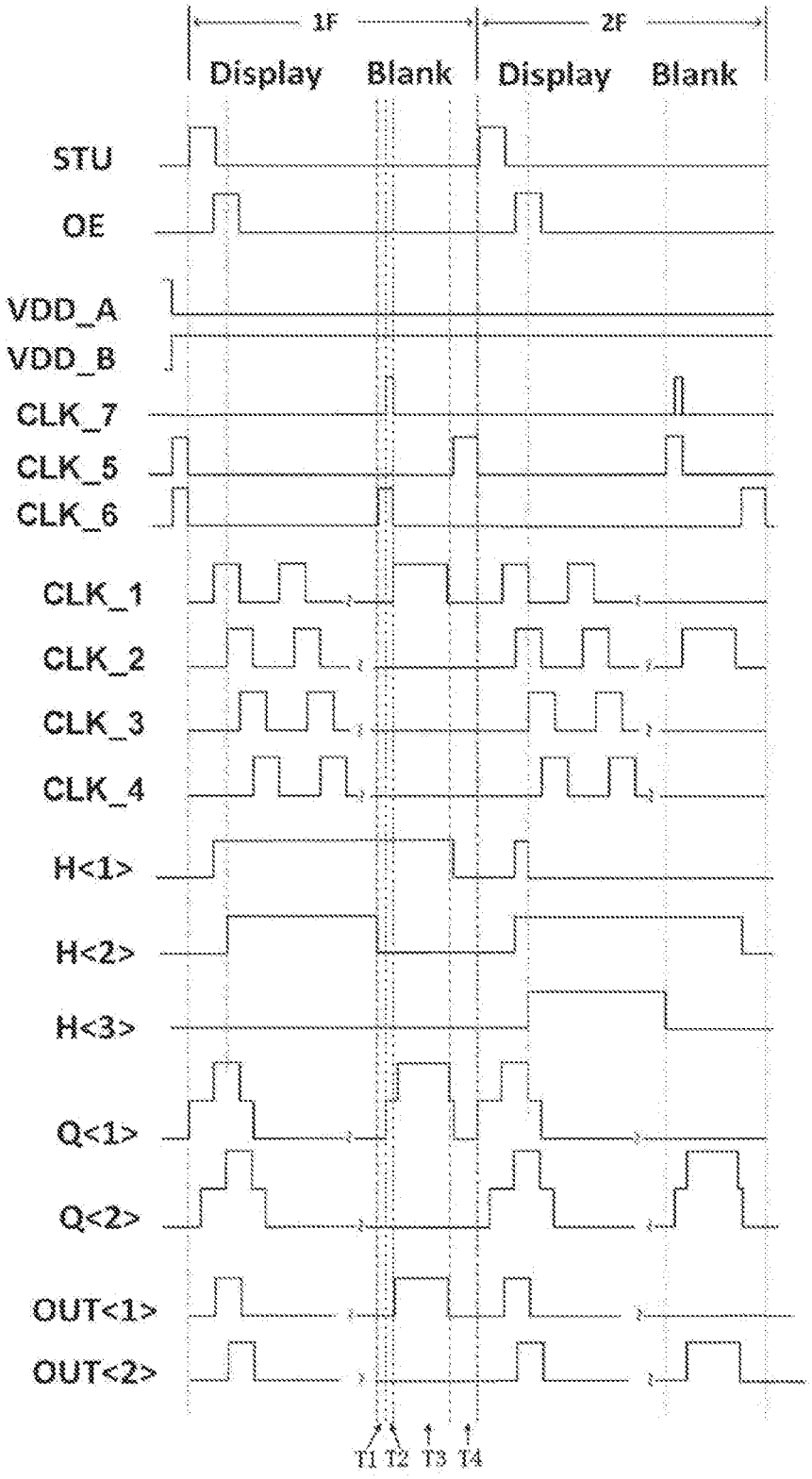
FIG. 9 is a timing diagram of signals for a random compensation of the gate driving circuit shown in FIG. 7 according to at least one embodiment of the present disclosure.

FIG. 8 shows a signal timing chart illustrating signals of the gate driving circuit 20 shown in FIG. 7 when used for the progressive sequential compensation, and FIG. 9 shows a signal timing chart illustrating signals of the gate driving circuit 20 shown in FIG. 7 when used for the random compensation. In FIGS. 8 and 9, Q<1> and Q<2> respectively denote the first nodes Q in the shift register units of the first stage and the second stage in the gate driving circuit 20. OUT<1>, OUT<2>, OUT<3>, and OUT<4> respectively denote pixel signal output terminals OUT of the shift register units of the first stage, the second stage, the third stage, and the fourth stage in the gate driving circuit 20. 1F, 2F, 3F, and 4F denote a first frame, a second frame, a third frame, and a fourth frame, respectively. Display denotes a display period of the frame, and Blank denotes a blanking period of the frame. It should be noted that, since the shift signal output terminal CR and the pixel signal output terminal OUT in each stage of the shift register unit have a same potential, the shift signal output terminal CR is not shown in FIGS. 8 and 9.

It should be noted that the signal levels in the signal timing charts shown in FIGS. 8 and 9 are only schematic and do not represent the true level values.

The operation principle of the gate driving circuit 20 shown in FIG. 7 when used for the progressive sequential compensation is explained below with reference to the signal timing diagram in FIG. 8, for example, the shift register unit shown in FIG. 4 can be used as the shift register unit in the gate driving circuit 20 shown in FIG. 7.

When the progressive sequential compensation is performed, a DC low-level signal is input through the compensation selection control terminal OE, so that the first transistor M1 remains turned off. Before the first frame 1F starts, the fifth and sixth sub-clock signal lines CLK_5 and CLK_6 are supplied with a high level, and since the fifth and sixth sub-clock signal lines CLK_5 and CLK_6 are alternately coupled to the second clock signal terminal CLKB of the shift register unit, the second transistor M2 and the sixteenth transistor M16 of the shift register unit of each stage may be turned on, and thus the control node H and the first node Q of the shift register unit of each stage may be reset to implement global reset. Then, the signal supplied from the sixth sub-clock signal line CLK_6 becomes a low level, and the signal supplied from the fifth sub-clock signal line CLK_5 continues to remain the high level.

Since a high level is input from the fifth voltage terminal VDD_B, the ninth transistor M9 is turned on, so that the second node QB is charged to the high level. The high level of the second node QB turns on the eleventh transistor M11, thereby pulling down the first node Q to the low level.

In the display period Display of the first frame 1F, the operation of the shift register unit of the first stage is described as follows.

In a first stage 1, the blanking input signal terminal STU1 and the display input signal terminal STU2 of the shift register unit of the first stage are both coupled to the input signal line STU, so that the blanking input signal terminal STU1 and the display input signal terminal STU2 are both initially input with a high level, and at the same time, since the second clock signal terminal CLKB (coupled to the fifth sub-clock signal line CLK_5) is input with a high level, the second transistor M2 is turned on, and the control node H is charged to a high level, which is then stored by the first capacitor C1. The fifteenth transistor M15 is turned on by the high level of the display input signal terminal STU2, so that the second node QB may be secondarily pulled down.

Then, the second clock signal terminal CLKB is input with a low level, the second transistor M2 is turned off, and the display input signal terminal STU2 continues to be input with the high level, so that the high level signal of the second voltage terminal VDD can charge the first node Q through the fifth transistor M5, and the first node Q is pulled up to the high level, which is then stored by the second capacitor C2. The sixth transistor M6 and the seventh transistor M7 are turned on under the control of the first node Q, but since the fourth clock signal terminal CLKD (coupled to the first sub-clock signal line CLK_1) is input with a low level signal at this time, both the shift signal output terminal CR and the pixel signal output terminal OUT each output a low level signal.

In a second stage 2, the fourth clock signal terminal CLKD is input with a high level signal, the potential of the first node Q is further pulled up due to the bootstrap effect, so the sixth transistor M6 and the seventh transistor M7 remain turned on, and thus both the shift signal output terminal CR and the pixel signal output terminal OUT each output a high level signal. For example, the high level signal output from the shift signal output terminal CR may be used for scan shift from a shift register unit of a previous stage to that of a next stage, and the high level signal output from the pixel signal output terminal OUT may be used for driving the sub-pixel units in the display panel to perform display.

In a third stage 3, a low level signal is then input to the fourth clock signal terminal CLKD, and both the shift signal output terminal CR and the pixel signal output terminal OUT can be discharged through the fourth clock signal terminal CLKD, thereby completing the reset of the shift signal output terminal CR and the pixel signal output terminal OUT. Since the shift signal output terminal CR and the pixel signal output terminal OUT are reset to the low level, the potential of the first node Q is lowered by an amplitude with the coupling action between the transistors; meanwhile, the display reset signal terminal STD of the shift register unit of the first stage is coupled with the shift signal output terminal CR of the shift register unit of the fourth stage, and at this time, the shift signal output terminal CR of the shift register unit of the fourth stage does not output a high level signal, so that the first node Q is not pulled down, and the first node Q can be kept at a relatively high level.

In a fourth stage 4, the shift signal output terminal CR of the shift register unit of the fourth stage then outputs a high level, so that the display reset signal terminal STD of the shift register unit of the first stage is input with a high level signal, the seventeenth transistor M17 is turned on, and the first node Q is pulled down to the low level, completing the reset of the first node Q.

By the above process, the potential change of the first node Q of the first stage takes on a "tower shape". When the shift signal output terminal CR and the pixel signal output terminal OUT are at the high level, the potential of the first node Q rises due to the bootstrap effect, so that when the shift signal output terminal CR and the pixel signal output terminal OUT are discharged through the sixth transistor M6 and the seventh transistor M7, respectively, the current flowing through the transistors may be greater, and the discharge speed is faster. Meanwhile, since the charges accumulated at the shift signal output terminal CR and the pixel signal output terminal OUT can be discharged through the sixth transistor M6 and the seventh transistor M7, respectively, the twelfth transistor M12 and the thirteenth transistor M13 for resetting can be transistors with smaller sizes, so that the layout area occupied by the shift register unit can be reduced.

In the display period of the above-described first frame, since the first clock signal terminal CLKA (coupled to the seventh sub-clock signal line CLK_7) is always kept at the low level, the fourth transistor M4 is kept in the off state, and the fourth transistor M4 isolates the influence of the high level pre-stored at the control node H on the display period.

After the shift register unit of the first stage drives the sub-pixels in the first row in the display panel to complete display, the shift register unit of the second stage, the shift register unit of the third stage and the like drive the sub-pixel units in the display panel row by row to complete display driving of the frame. To this end, the display period of the first frame ends.

In the blanking period Blank of the first frame 1F, the operation process of the shift register unit of the first stage is described below.

In a fifth stage 5, the control node H maintains the high level of the display period due to the storage of the first capacitor C1, the first clock signal terminal CLKA (coupled to the seventh sub-clock signal line CLK_7) and the third clock signal terminal CLKC (coupled to the sixth sub-clock signal line CLK_6) are input with the high level signal at the beginning, the third transistor M3 and the fourth transistor M4 are turned on, so that the high level of the third clock signal terminal CLKC may charge the first node Q, pulling the first node Q up to the high level. The tenth transistor M10 is turned on under the control of the first node Q, the second node QB is pulled down to the low level, and the fourteenth transistor M14 is also turned on under the control of the first clock signal terminal CLKA, which may further pull down the second node QB.

In a sixth stage 6, the first clock signal terminal CLKA is input with a low level signal, and the fourth transistor M4 is turned off. The fourth clock signal terminal CLKD (coupled to the first sub-clock signal line CLK_1) is input with a high level signal, the potential of the first node Q is further pulled up due to the bootstrap effect, the sixth transistor M6 and the seventh transistor M7 are turned on, and the high level signal input from the fourth clock signal terminal CLKD may be output to the shift signal output terminal CR and the pixel signal output terminal OUT. For example, the signal output by the pixel signal output terminal OUT can be used to drive a sensing transistor in a sub-pixel unit in the display panel to achieve external compensation.

Meanwhile, since the second clock signal terminal CLKB of the shift register unit of the second stage is coupled to the sixth sub-clock signal line CLK_6 and the blanking input signal terminal STU1 of the shift register unit of the second stage is coupled to the shift signal output terminal CR of the shift register unit of the first stage, the second transistor M2 in the shift register unit of the second stage is turned on, so that the control node H<2> in the shift register unit of the second stage is pulled up to a high level.

In a seventh stage 7, after the control node H<2> in the shift register unit of the second stage is sufficiently written with the high level, the sixth sub-clock signal line CLK_6 is input with the low level signal. Meanwhile, the fourth clock signal terminal CLKD is continuously input with the high level, so the shift signal output terminal CR and the pixel signal output terminal OUT of the shift register unit of the first stage keep outputting the high level signal. In this process, the fourth transistor M4 is kept in the off state all the time, so that the first node Q<1> can be prevented from leaking through the fourth transistor M4.

In an eighth stage 8, that is, in a last stage of the blanking period, the fifth sub-clock signal line CLK_5 is input with a high level signal, and since the second clock signal terminals CLKB of the shift register units of the odd-numbered stages are all coupled to the fifth sub-clock signal line CLK_5, the reset of the control nodes H and the first nodes Q in all the shift register units of the odd-numbered stages, particularly the reset of the first nodes Q of the first and third stages and the control node H of the first stage, can be completed. Since the threshold voltage of the transistor may be positively drifted when a positive voltage is applied to the transistor, the time for which the control node H needs to be kept at the positive voltage can be shortened by the above manner, so that the time for the threshold voltage of the transistor to be positively drifted is shortened, and the reliability of the transistor is improved.

At this point, the driving timing of the first frame ends.

In the display period of the second frame, the gate driving circuit 20 repeats the same operation as the display period of the first frame, and is not described here again.

In the blanking period of the second frame, for the shift register unit of the second stage, since the third clock signal terminal CLKC is coupled to the fifth sub-clock signal line CLK_5, at the beginning of the blanking period, the first clock signal terminal CLKA and the third clock signal terminal CLKC of the shift register unit of the second stage each are input with a high level signal, and the third transistor M3 and the fourth transistor M4 are turned on, so that the high level input by the third clock signal terminal CLKC can charge the first node Q, pulling up the first node Q to a high level. Then, when a high level signal is input to the second sub-clock signal line CLK_2, the shift signal output terminal CR and the pixel signal output terminal OUT output high level signals while charging the control node H in the shift register unit of the third stage. At the last stage of the blanking period of the second frame, a high level signal is input by the sixth sub-clock signal line CLK_6, and since the second clock signal terminals CLKB of the shift register units of the even-numbered stages are all coupled to the sixth sub-clock signal line CLK_6, the reset of the control nodes H and the first nodes Q in all the shift register units of the even-numbered stages can be completed.

At this point, the driving timing of the second frame ends. For the subsequent driving of the gate driving circuit in more stages in the third frame, the fourth frame, the fifth frame and the like, reference may be made to the above description, and details are not repeated here.

As described above, the gate driving circuit outputs the driving signals for the sensing transistors in the sub-pixel units in the display panel in the blanking period of each frame, and the driving signals are sequentially supplied row by row. For example, in the blanking period of the first frame, the gate driving circuit outputs the driving signal for the sub-pixel units of the first row in the display panel, in the blanking period of the second frame, the gate driving circuit outputs the driving signal for the sub-pixel units of the second row in the display panel, and so on, the progressive sequential compensation is completed.

The operation principle of the gate driving circuit 20 shown in FIG. 7 when used for random compensation is described below with reference to the signal timing diagram in FIG. 9, for example, the shift register unit shown in FIG. 4 may be used as the shift register unit in the gate driving circuit 20 shown in FIG. 7.

In the display period of the first frame, the operation principle of the gate driving circuit is similar to that in the above-described progressive sequential compensation, and only the difference is described below. As shown in FIG. 9, when the pixel signal output terminal OUT<1> (i.e., the shift signal output terminal CR) of the shift register unit of the first stage outputs a high level signal, the compensation selection control terminal OE is also supplied with a high level signal, at which time the control node H<1> of the shift register unit of the first stage is charged to a high level, and then the control node H<2> of the shift register unit of the second stage is also charged to a high level because the output pulses of OUT<1> and OUT<2> overlap.

As can be seen from the above, in the display period of the first frame, the control node H<1> of the shift register unit of the first stage and the control node H<2> of the shift register unit of the second stage are both charged to the high level, but in the blanking period of the first frame, for example, when it is necessary to output a driving signal for detecting the first row of sub-pixel units in the display panel in the frame, the following operation is performed in the blanking period of the first frame.

In a first stage T1, a high level signal is input by the sixth sub-clock signal line CLK_6, thereby discharging the control nodes H of shift register units of the even-numbered stages, that is, eliminating the high level of H<2> (for example, eliminating the high levels of the control nodes H of the shift register units of the $(n-1)^{th}$ and the $(n+1)^{th}$ stages, if the shift register unit of the $n^{th}$ stage needs to be detected in the frame).

In a second stage T2, the seventh sub-clock signal line CLK_7 (coupled to the first clock signal terminal CLKA) is input with a high level signal, the third clock signal terminal CLKC of the shift register unit of the first stage maintains to be input with the high level signal, the third transistor M3 and the fourth transistor M4 are turned on, and the charging of the first node Q is completed.

In a third stage T3, low-level signals are input by the sixth and seventh sub-clock signal lines CLK_6 and CLK_7, and a high level signal is input by the first sub-clock signal line CLK_1, so the shift signal output terminal and the pixel signal output terminal OUT output high level signals. For example, the signal output by the pixel signal output terminal OUT can be used to drive the sensing transistor in the sub-pixel units of the first row in the display panel for external compensation. Then, the signal of the first sub-clock signal line CLK_1 becomes a low level signal, and accordingly, the shift signal output terminal and the pixel signal output terminal OUT output low level signals.

In a fourth stage T4, that is, in the last stage of the blanking period of the first frame, a high level signal is input by the fifth sub-clock signal line CLK_5, and since the second clock signal terminals CKLB of the shift register units of the odd-numbered stages are all coupled to the fifth sub-clock signal line CLK_5, the reset of the control nodes H and the first nodes Q in all the shift register units of the odd-numbered stages, and particularly the reset of the first node Q and the control node H of the shift register unit of the first stage, can be completed.

For example, when a driving signal for detecting the second row of sub-pixel units in the display panel needs to be output in the blanking period of the second frame, the following operation is performed in the second frame.

In the display period of the second frame, the signal input by the compensation selection control terminal OE is made to be the same as the signal outputted by the pixel signal output terminal OUT<2> (i.e., the shift signal output terminal CR) of the shift register unit of the second stage, and the control nodes H<1>, H<2> and H<3> of the shift register units of the first stage, the second stage and the third stage are all charged to a high level under the control of the compensation selection control terminal OE due to the overlap of output pulses of the pixel signal output terminals OUT<2>, OUT<1> and OUT<3> (not shown in FIG. 9) of the shift register units of the first to third stages. Since the first electrode of the first transistor M1 of the shift register unit of the first stage is coupled to the shift signal output terminal CR of the shift register unit of the first stage, the control node H<1> is charged to the high level and then pulled down fast by the low level of the shift signal output terminal CR (i.e., the pixel signal output terminal OUT<1>).

For the operation principle in the blanking period of the second frame, reference may be made to the corresponding description in the blanking period of the first frame, which is not described here in detail.

Figure 11:
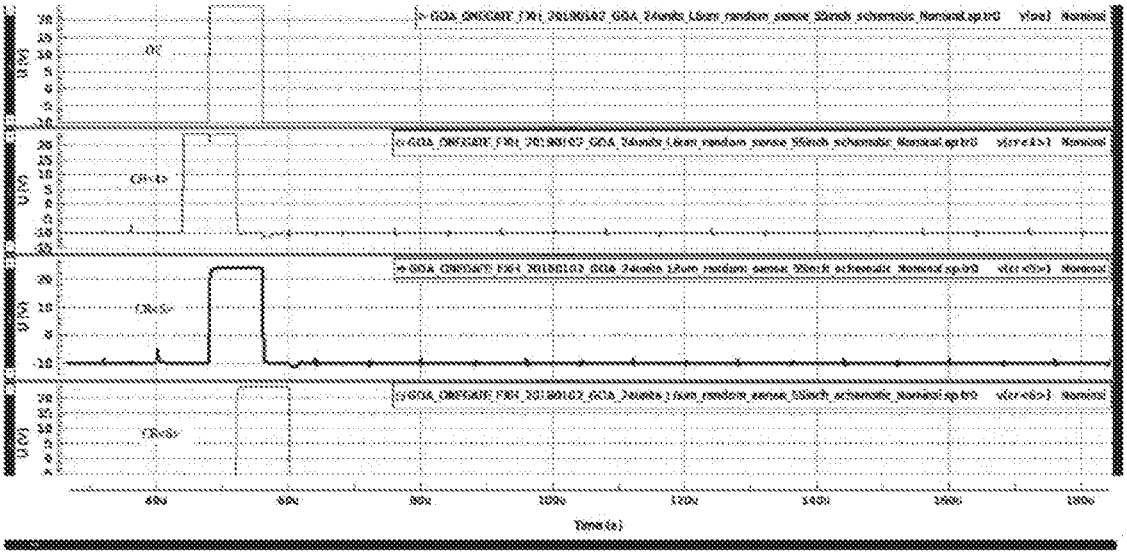
FIG. 11 is a timing simulation diagram according to at least one embodiment of the present disclosure.

It should be noted that, in order to more conveniently illustrate the signal timing, when the above description is made on the operation principle of the random compensation, the description is given by taking as an example that the driving signal corresponding to the first row of the sub-pixel units of the display panel is output in the blanking period of the first frame, and the disclosure is not limited thereto. For example, as in the timing simulation diagram shown in FIG. 11, when it is necessary to output a driving signal corresponding to the fifth row of sub-pixel units of the display panel in the blanking period of a certain frame, it is necessary to control so that the timings of the signals supplied to the compensation selection control terminal OE and the signal output terminal CR<5> of the shift register unit of the fifth stage are the same. It should be noted here that the two signals having the same timing refers to that the two signals are at a high level synchronously, and the two signals are not required to have the same amplitude. CR<4> and CR<6> in FIG. 11 denote a shift signal output terminal of the shift register unit of the fourth stage and a shift signal output terminal of the shift register unit of the sixth stage, respectively.

As described above, by providing the compensation selection circuit 400 (the first transistor M1), when it is necessary to output the driving signal corresponding to the sub-pixel units of the $n^{th}$ row of the display panel in the blanking period of a certain frame, it is necessary to make the signal supplied to the compensation selection control terminal OE and the signal of the shift signal output terminal CR of the shift register unit of the $n^{th}$ stage have a same timing, whereby the random compensation can be achieved, where n is an integer greater than 0.

Figure 10:
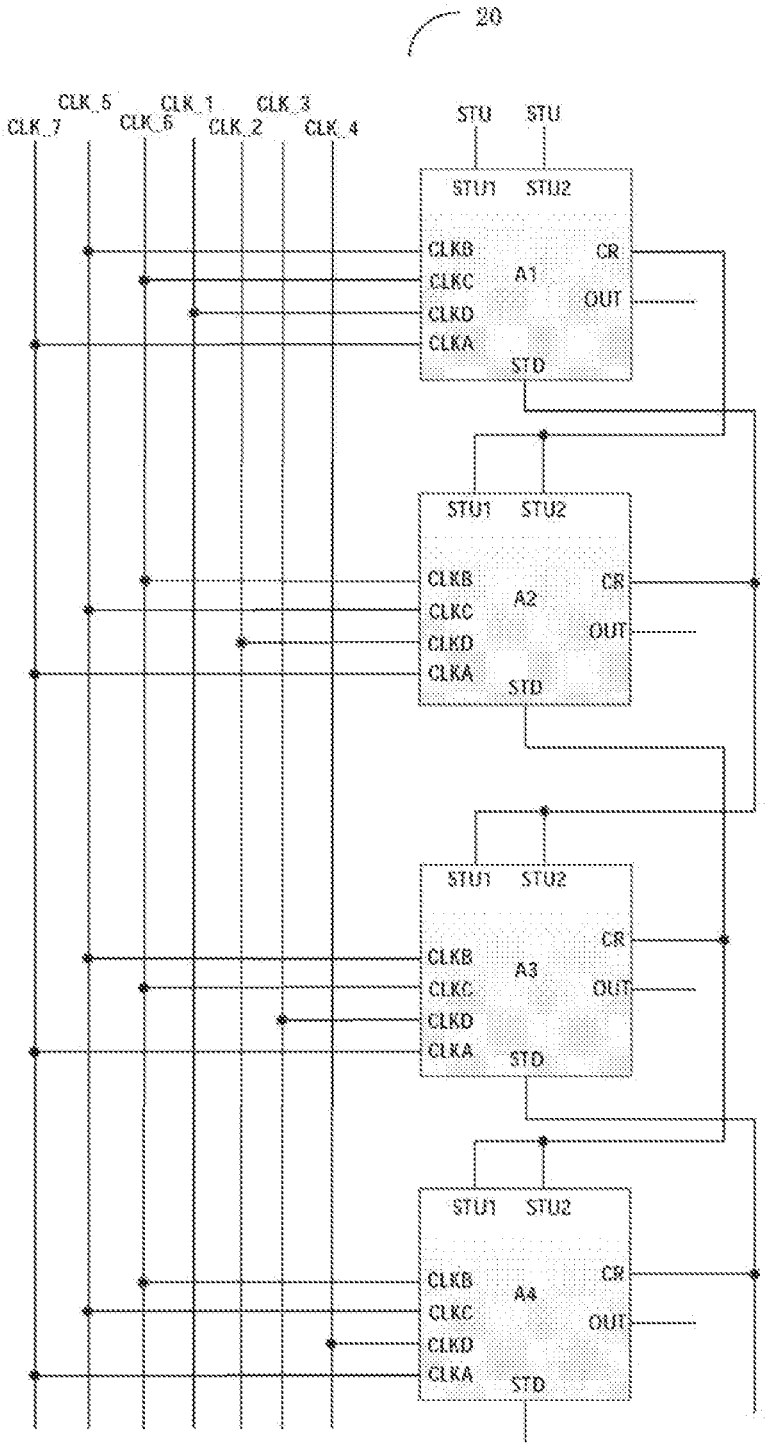
FIG. 10 is a schematic diagram of another gate driving circuit according to at least one embodiment of the present disclosure.

As shown in FIG. 10, another embodiment of the present disclosure further provides a gate driving circuit 20, the differences between the present gate driving circuit 20 and the gate driving circuit 20 shown in FIG. 7 include: the blanking input signal terminal STU1 and the display input signal terminal STU2 of the shift register unit of the $(n+1)^{th}$ stage, except for the shift register unit of the first stage, are coupled to the shift signal output terminal CR of the shift register unit of the $n^{th}$ stage; the display reset signal terminal STD of the shift register unit of the $n^{th}$ stage, except for the shift register unit of the last stage, is coupled to the shift signal output terminal CR of the shift register unit of the $(n+1)^{th}$ stage. There is no overlap between the signal pulses output by the gate drive circuit 20 shown in FIG. 10.

Figure 12:
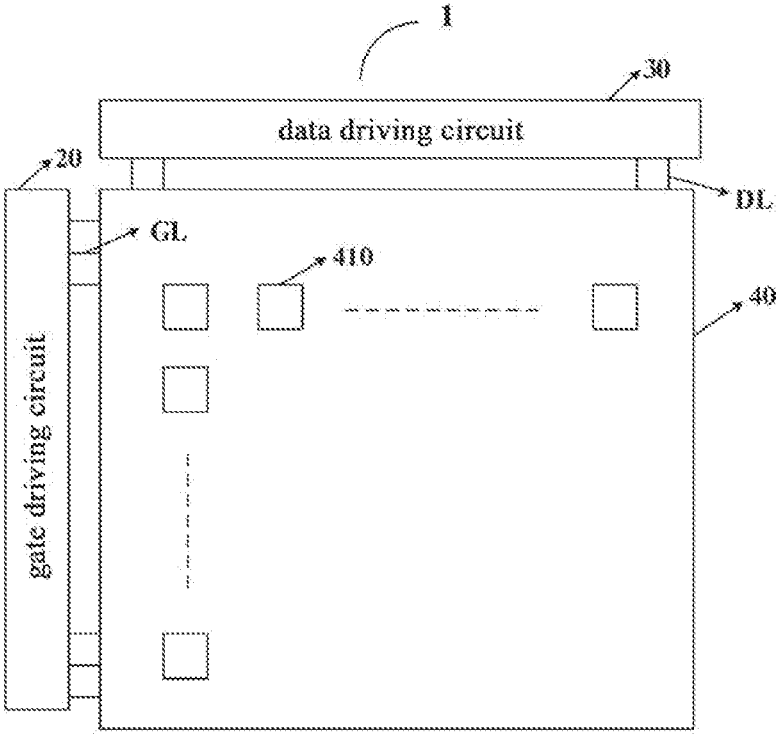
FIG. 12 is a schematic diagram of a display device according to at least one embodiment of the present disclosure.
Figure 13:
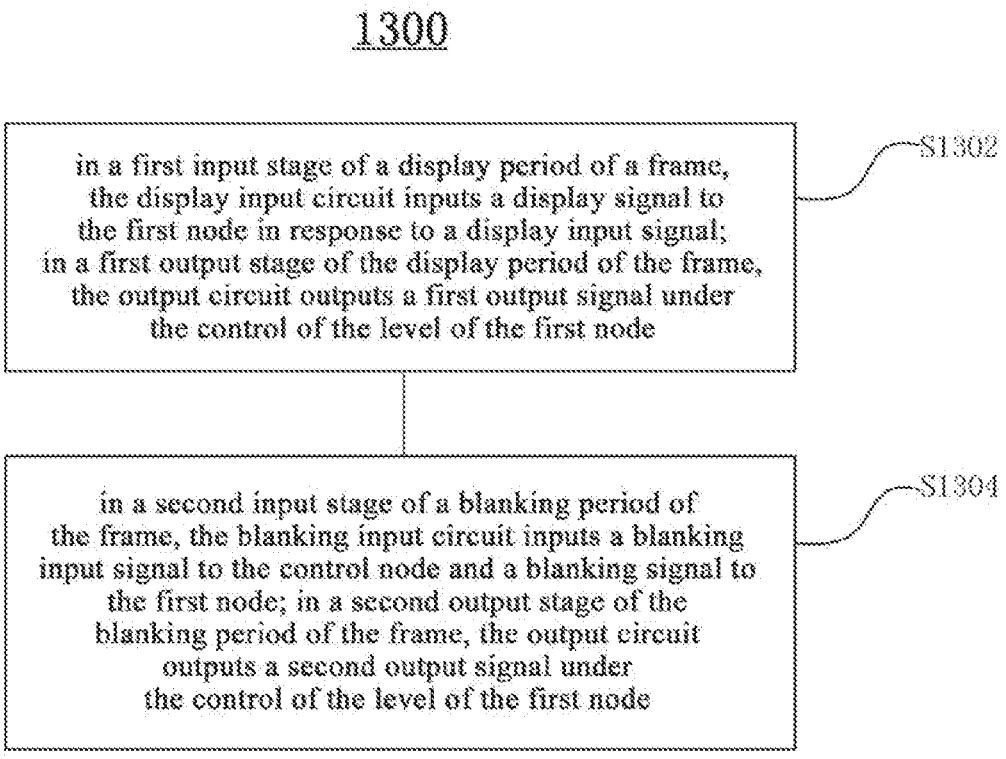
FIG. 13 is a schematic flowchart of a driving method of a shift register unit according to at least one embodiment of the present disclosure.
Figure 14:
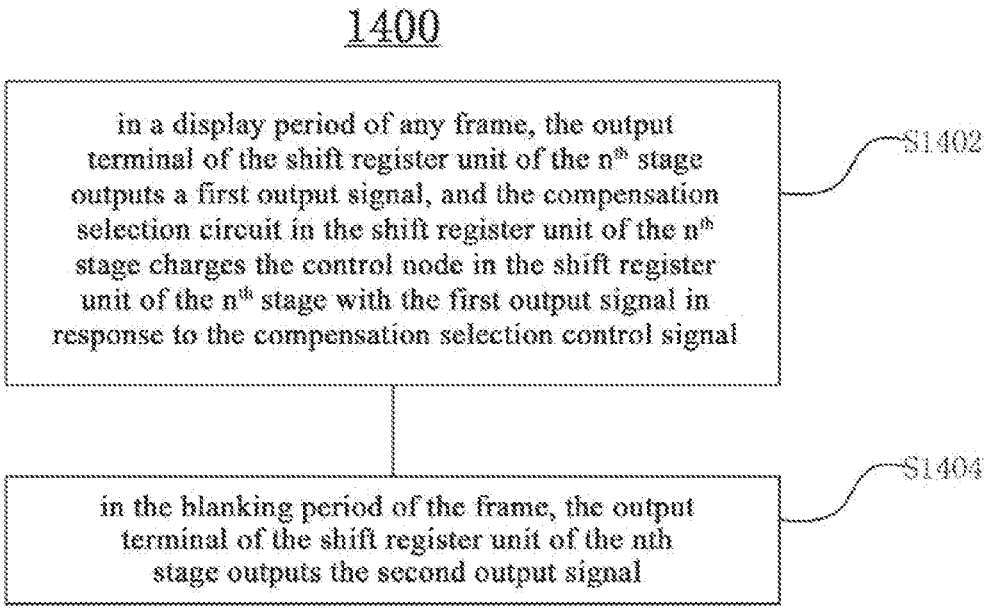
FIG. 14 is a schematic flowchart of a driving method of a gate driving circuit according to at least one embodiment of the present disclosure.

An embodiment of the present disclosure also provides a display device 1, as shown in FIG. 12, the display device 1 includes the gate driving circuit 20 provided by the embodiments of the present disclosure. The display device 1 further includes a display panel 40, which includes a plurality of sub-pixel units 410 in an array. For example, the display device 1 may further include a data driving circuit 30. The data driving circuit 30 is used for supplying data signals to the pixel array. The gate drive circuit 20 is used to provide driving signals to the pixel array, for example, the driving signals may drive scan transistors and sense transistors in the sub-pixel units 410. The data driving circuit 30 is electrically coupled to the sub-pixel units 410 through data lines DL, and the gate driving circuit 20 is electrically coupled to the sub-pixel units 410 through gate lines GL.

Note that, the display device 1 in the present embodiment may be any product or component with a display function, such as a liquid crystal panel, a liquid crystal television, a display, an OLED panel, an OLED television, an electronic paper display device, a mobile phone, a tablet computer, a notebook computer, a digital photo frame, a navigator and the like.

Technical effects of the display device 1 provided by the embodiments of the present disclosure can refer to corresponding descriptions about the gate driving circuit 20 in the above embodiments, and are not described herein again.

Embodiments of the present disclosure also provide a driving method 1300, which may be used to drive the shift register unit 10 provided by the embodiments of the present disclosure, where the driving method 1300 includes the following steps.

At step S1302, in a first input stage of a display period of the frame, the display input circuit 200 inputs a display signal to the first node Q in response to a display input signal; in a first output stage of the display period of the frame, the output circuit 300 outputs a first output signal under the control of the level of the first node Q. For example, the first output signal may be used to drive the sub-pixel units in the display panel to display.

At step S1304, in a second input stage of a blanking period of the frame, the blanking input circuit 100 inputs a blanking input signal to the control node H and a blanking signal to the first node Q; in a second output stage of the blanking period of the frame, the output circuit 300 outputs a second output signal under the control of the level of the first node Q. For example, the second output signal may be used to drive the sub-pixel units in the display panel to perform external compensation. The composite output signal includes a first output signal and a second output signal.

In another embodiment, the driving method 1300 may further include: the compensation selection circuit 400 charges the control node with the first output signal in response to the compensation selection control signal during the display period of the frame.

Embodiments of the present disclosure also provide a driving method 1400, which may be used to drive the gate driving circuit 20 provided by the embodiments of the present disclosure, and the driving method includes the following steps.

At step S1402, when the gate driving circuit 20 drives a display panel, in a display period of any frame, the output terminal of the shift register unit 10 of the $n^{th}$ stage outputs a first output signal, and the compensation selection circuit 400 in the shift register unit 10 of the $n^{th}$ stage charges the control node H in the shift register unit 10 of the $n^{th}$ stage with the first output signal in response to the compensation selection control signal.

At step S1404, in the blanking period of the frame, the output terminal of the shift register unit of the $n^{th}$ stage outputs the second output signal. The composite output signal includes a first output signal and the second output signal, where n is an integer greater than 0.

It should be noted that, for detailed description and technical effects of the driving method provided by the embodiments of the present disclosure, reference may be made to the description of the operation principles of the shift register unit 10 and the gate driving circuit 20 in the embodiments of the present disclosure, and details are not described here.

The above is only specific embodiments of the present disclosure, but the scope of the present disclosure is not limited thereto, and the scope of the present disclosure should be determined by the scope of the claims.

What is claimed is:

1. A shift register unit comprises a blanking input circuit, a display input circuit, an output circuit and a compensation selection circuit, wherein the blanking input circuit is configured to input a blanking input signal to a control node and to input a blanking *pulling-up* signal to a first node during a blanking period of a frame;

the display input circuit is configured to input a display signal to the first node in a display period of the frame in response to a display input signal;

the output circuit is configured to output a composite output signal to an output terminal under the control of a level of the first node; and the compensation selection circuit is electrically coupled to the output terminal and configured to charge the control node with the composite output signal in response to a compensation selection control signal.

2. The shift register unit of claim [1] *28*, wherein the composite output signal comprises a first output signal and a second output signal, in the display period of the frame, the output circuit is configured to output the first output signal to the output terminal under the control of the level of the first node; and in the blanking period of the frame, the output circuit is configured to output the second output signal to the output terminal under the control of the level of the first node.

3. The shift register unit of claim 2, wherein, in the display period of the frame, the compensation selection circuit is configured to charge the control node with the first output signal in response to the compensation selection control signal.

4. The shift register unit of claim 3, wherein the output terminal comprises a shift signal output terminal, the shift signal output terminal outputs the composite output signal, and the compensation selection circuit comprises a first transistor;

a gate of the first transistor is coupled to a compensation selection control terminal to receive the compensation selection control signal, a first electrode of the first transistor is coupled to the shift signal output terminal to receive the composite output signal, and a second electrode of the first transistor is coupled to the control node.

5. The shift register unit of claim 4, wherein the blanking input circuit *further* comprises:

a charging sub-circuit configured to input the blanking input signal to the control node in response to a second clock signal;

a storage sub-circuit configured to store the blanking input signal input by the charging sub-circuit[; and an isolation sub-circuit configured to input the blanking signal to the first node under the control of a level of the control node and a first clock signal].

6. The shift register unit of claim 5, wherein the charging sub-circuit comprises a second transistor, a gate of the second transistor is coupled to a second clock signal terminal to receive the second clock signal, a first electrode of the second transistor is coupled to a blanking input signal terminal to receive the blanking input signal, and a second electrode of the second transistor is coupled to the control node;

the storage sub-circuit comprises a first capacitor, a first electrode of the first capacitor is coupled to the control node, and a second electrode of the first capacitor is coupled to a first voltage terminal to receive a first voltage[;

the isolation sub-circuit comprises a third transistor and a fourth transistor, a gate of the third transistor is coupled to the control node, a first electrode of the third transistor is coupled to a third clock signal terminal to receive a third clock signal as the blanking signal, a second electrode of the third transistor is coupled to a first electrode of the fourth transistor, a gate of the fourth transistor is coupled to a first clock signal terminal to receive the first clock signal, and a second electrode of the fourth transistor is coupled to the first node].

7. The shift register unit of claim [6,] *1,* wherein the display input circuit comprises a fifth transistor;

a gate of the fifth transistor is coupled to a display input signal terminal to receive the display input signal, a first electrode of the fifth transistor is coupled to a second voltage terminal to receive a second voltage as the display signal, and a second electrode of the fifth transistor is coupled to the first node.

8. The shift register unit of claim 4, wherein the output terminal further comprises a pixel signal output terminal, the pixel signal output terminal outputs the composite output signal, and the output circuit comprises a sixth transistor, a seventh transistor, and a second capacitor;

a gate of the sixth transistor is coupled to the first node, a first electrode of the sixth transistor is coupled to a fourth clock signal terminal to receive a fourth clock signal as the composite output signal, and a second electrode of the sixth transistor is coupled to the shift signal output terminal;

a gate of the seventh transistor is coupled to the first node, a first electrode of the seventh transistor is coupled to the fourth clock signal terminal to receive the fourth clock signal as the composite output signal, and a second electrode of the seventh transistor is coupled to the pixel signal output terminal;

a first electrode of the second capacitor is coupled to the first node, and a second electrode of the second capacitor is coupled to the second electrode of the sixth transistor.

9. The shift register unit of claim 4, further comprising a noise reduction circuit and a first control circuit, wherein the output terminal further comprises a pixel signal output terminal, and the pixel signal output terminal outputs the composite output signal;

the first control circuit is configured to control a level of a second node under the control of the level of the first node; and the noise reduction circuit is configured to reduce noise of the first node, the shift signal output terminal, and the pixel signal output terminal under the control of the level of the second node.

10. The shift register unit of claim 9, wherein the first control circuit comprises an eighth transistor, a ninth transistor, and a tenth transistor;

a gate and a first electrode of the eighth transistor are coupled together and configured to be coupled to a fourth voltage terminal to receive a fourth voltage, and a second electrode of the eighth transistor is coupled to the second node;

a gate and a first electrode of the ninth transistor are coupled together and configured to be coupled to a fifth voltage terminal to receive a fifth voltage, and a second electrode of the ninth transistor is coupled to the second node; and a gate of the tenth transistor is coupled to the first node, a first electrode of the tenth transistor is coupled to the second node, and a second electrode of the tenth transistor is coupled to a first voltage terminal to receive a first voltage.

11. The shift register unit of claim 9, wherein the noise reduction circuit comprises an eleventh transistor, a twelfth transistor, and a thirteenth transistor;

a gate of the eleventh transistor is coupled to the second node, a first electrode of the eleventh transistor is coupled to the first node, and a second electrode of the eleventh transistor is coupled to a first voltage terminal to receive a first voltage;

a gate of the twelfth transistor is coupled to the second node, a first electrode of the twelfth transistor is coupled to the shift signal output terminal, and a second electrode of the twelfth transistor is coupled to the first voltage terminal to receive the first voltage; and a gate of the thirteenth transistor is coupled to the second node, a first electrode of the thirteenth transistor is coupled to the pixel signal output terminal, and a second electrode of the thirteenth transistor is coupled to a third voltage terminal to receive a third voltage.

12. The shift register unit of claim 9, further comprising a second control circuit, wherein the second control circuit is configured to control the level of the second node in response to a blanking control signal.

13. The shift register unit of claim 12, wherein the second control circuit comprises a fourteenth transistor, and the blanking control signal comprises a first clock signal;

a gate of the fourteenth transistor is coupled to a first clock signal terminal to receive the first clock signal, a first electrode of the fourteenth transistor is coupled to the second node, and a second electrode of the fourteenth transistor is coupled to a first voltage terminal to receive a first voltage.

14. The shift register unit of claim 9, further comprising a third control circuit, wherein the third control circuit is configured to control the level of the second node in response to a display control signal.

15. The shift register unit of claim 14, wherein the third control circuit comprises a fifteenth transistor, and the display control signal comprises the display input signal; and a gate of the fifteenth transistor is coupled to a display input signal terminal to receive the display input signal, a first electrode of the fifteenth transistor is coupled to the second node, and a second electrode of the fifteenth transistor is coupled to a first voltage terminal to receive a first voltage.

16. The shift register unit of claim 15, further comprising a blanking reset circuit, wherein the blanking reset circuit is configured to reset the first node in response to a blanking reset signal.

17. The shift register unit of claim 16, wherein the blanking reset circuit comprises a sixteenth transistor; and a gate of the sixteenth transistor is coupled to a second clock signal terminal to receive a second clock signal as the blanking reset signal, a first electrode of the sixteenth transistor is coupled to the first node, and a second electrode of the sixteenth transistor is coupled to the first voltage terminal to receive the first voltage.

18. The shift register unit of claim 14, further comprising a display reset circuit, wherein the display reset circuit is configured to reset the first node in response to a display reset signal.

19. The shift register unit of claim 18, wherein the display reset circuit comprises a seventeenth transistor;

a gate of the seventeenth transistor is coupled to a display reset signal terminal to receive the display reset signal, a first electrode of the seventeenth transistor is coupled to the first node, and a second electrode of the seventeenth transistor is coupled to a first voltage terminal to receive a first voltage.

20. A gate driving circuit comprising a plurality of shift register units, which are cascaded, wherein each of the shift register units is the shift register unit of claim 1.

21. The gate driving circuit of claim 20, further comprising a first sub-clock signal line, a second sub-clock signal line, a third sub-clock signal line, and a fourth sub-clock signal line, wherein, in a case where the shift register unit comprises a fourth clock signal terminal, the fourth clock signal terminal of the shift register unit of the $(4n-3)^{th}$ stage is coupled to the first sub-clock signal line;

the fourth clock signal terminal of the shift register unit of the $(4n-2)^{th}$ stage is coupled to the second sub-clock signal line;

the fourth clock signal terminal of the shift register unit of the $(4n-1)^{th}$ stage is coupled to the third sub-clock signal line; and the fourth clock signal terminal of the shift register unit of the $(4n)^{th}$ stage is coupled to the fourth sub-clock signal line;

wherein n is an integer greater than 0.

22. The gate driving circuit of claim 21, further comprising a fifth sub-clock signal line and a sixth sub-clock signal line, wherein, in a case where the shift register unit comprises a second clock signal terminal and a third clock signal terminal, the second clock signal terminal of the shift register unit of the $(2n-1)^{th}$ stage is coupled to the fifth sub-clock signal line, and the third clock signal terminal of the shift register unit of the $(2n-1)^{th}$ stage is coupled to the sixth sub-clock signal line;

the second clock signal terminal of the shift register unit of the $(2n)^{th}$ stage is coupled to the sixth sub-clock signal line, and the third clock signal terminal of the shift register unit of the $(2n)^{th}$ stage is coupled to the fifth sub-clock signal line, wherein n is an integer greater than 0.

23. The gate driving circuit of claim 20, wherein in a case where the shift register unit includes a blanking input signal terminal, a display input signal terminal and a shift signal output terminal, the blanking input signal terminal of the shift register unit of the $(n+1)^{th}$ stage is coupled to the shift signal output terminal of the shift register unit of the $n^{th}$ stage;

the display input signal terminal of the shift register unit of the $(n+2)^{th}$ stage is coupled to the shift signal output terminal of the shift register unit of the $n^{th}$ stage;

wherein n is an integer greater than 0.

24. A display device comprising a gate driving circuit as claimed in claim 20.

25. A driving method of the gate driving circuit of claim 20, comprising:

when the gate driving circuit drives a display panel, in a display period of any frame, the output terminal of the shift register unit of the $n^{th}$ stage outputs a first output signal, and the compensation selection circuit in the shift register unit of the $n^{th}$ stage charges the control node in shift register unit of the $n^{th}$ stage by using the first output signal in response to the compensation selection control signal;

in a blanking period of the frame, the output terminal of the shift register unit of the $n^{th}$ stage outputs a second output signal;

wherein the composite output signal comprises the first output signal and the second output signal, and n is an integer greater than 0.

26. A driving method of the shift register unit of claim 1, comprising:

the display period of the frame, comprising:

a first input stage in which the display input circuit inputs the display signal to the first node in response to the display input signal;

a first output stage in which the output circuit outputs a first output signal under the control of the level of the first node;

a blanking period of the frame, comprising:

a second input stage in which the blanking input circuit inputs the blanking input signal to the control node and inputs the blanking *pulling-up* signal to the first node;

a second output stage in which the output circuit outputs a second output signal under the control of the level of the first node;

wherein the composite output signal comprises the first output signal and the second output signal.

27. The driving method of claim 26, further comprising:

the compensation selection circuit charges the control node with the first output signal in response to the compensation selection control signal during the display period of the frame.

*28. The shift register of claim 1, further comprising a twenty-first transistor and a fourth leakage prevention transistor, which are configured to prevent leakage of charges of the first node;*

*the blanking input circuit comprises an isolation sub-circuit configured to input the blanking pulling-up signal to the first node under the control of a level of the control node and a first clock signal; the isolation sub-circuit comprises a third transistor and a fourth transistor, a gate of the third transistor is coupled to the control node, a first electrode of the third transistor receives the blanking pulling-up signal, a second electrode of the third transistor is coupled to a first electrode of the fourth transistor, a gate of the fourth transistor is coupled to a first clock signal terminal to receive a first clock signal, and a second electrode of the fourth transistor is coupled to the first electrode of the fourth leakage prevention transistor, a gate of the fourth leakage prevention transistor is coupled to the first clock signal terminal to receive the first clock signal, and a second electrode of the fourth leakage prevention transistor is coupled to the first node; a first electrode of the twenty-first transistor is coupled to a second voltage terminal, a gate of the twenty-first transistor is coupled to the first node, and a second electrode of the twenty-first transistor is coupled to the first electrode of the fourth leakage prevention transistor.*

* * * * *